United States Patent
Matsuoka et al.

(10) Patent No.: US 6,560,135 B2
(45) Date of Patent: May 6, 2003

(54) MAGNETIC SEMICONDUCTOR MEMORY APPARATUS AND METHOD OF MANUFACTURING THE SAME

(75) Inventors: Hideyuki Matsuoka, Nishitokyo (JP); Takeshi Sakata, Hino (JP); Katsuro Watanabe, Odawara (JP); Kiyoo Itoh, Higashikurume (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/934,602

(22) Filed: Aug. 23, 2001

(65) Prior Publication Data
US 2002/0093845 A1 Jul. 18, 2002

(30) Foreign Application Priority Data
Jan. 12, 2001 (JP) .................................. 2001-004395

(51) Int. Cl.[7] .............................................. G11C 17/02
(52) U.S. Cl. ......................... 365/97; 365/171; 365/173
(58) Field of Search .............................. 365/158, 171, 365/173, 66, 97, 209, 145

(56) References Cited

U.S. PATENT DOCUMENTS 6,351,408 B1 * 2/2002 Schwarzl et al. ............ 365/158
6,359,805 B1 * 3/2002 Hidaka ........................ 365/171
6,392,924 B1 * 5/2002 Liu et al. ..................... 365/158

* cited by examiner

Primary Examiner—David Nelms
Assistant Examiner—Gene N. Auduong
(74) Attorney, Agent, or Firm—Antonelli, Terry, Stout & Kraus, LLP

(57) ABSTRACT

Since a memory cell of a so-called MRAM utilizing a conventional tunnel magnetic resistance forms writing word lines below data lines, there are the following problems. A process becomes hard because it is necessary to execute a self-aligned contact opening process with passing through portions between the writing word lines, or since it is hard that the writing word lines sufficiently overlap with a magnetic resistance device in a planner manner due to a restriction of layout, the data writing becomes unstable. In order to solve the problems mentioned above, the present invention provides a structure of MRAM memory cell in which the writing word lines are formed above the bit lines, and a method of manufacturing the same. In accordance with the present invention, a process at a time of forming a memory cell plug becomes easy in comparison with a conventional one, there can be obtained a layout so that a magnetic field from the writing word line effectively acts on a magnetic resistance device due to the writing word line formed in an upper portion, and a stable writing can be executed.

22 Claims, 27 Drawing Sheets $R^{-1} \sim D_1(E) \cdot D_2(E)$
1 : BEFORE TUNNELING
2 : AFTER TUNNELING

RESISTANCE : SMALL

IN THE CASE OF PARALLEL SPIN DIRECTION

RESISTANCE : LARGE

IN THE CASE OF ANTI-PARALLEL SPIN DIRECTION

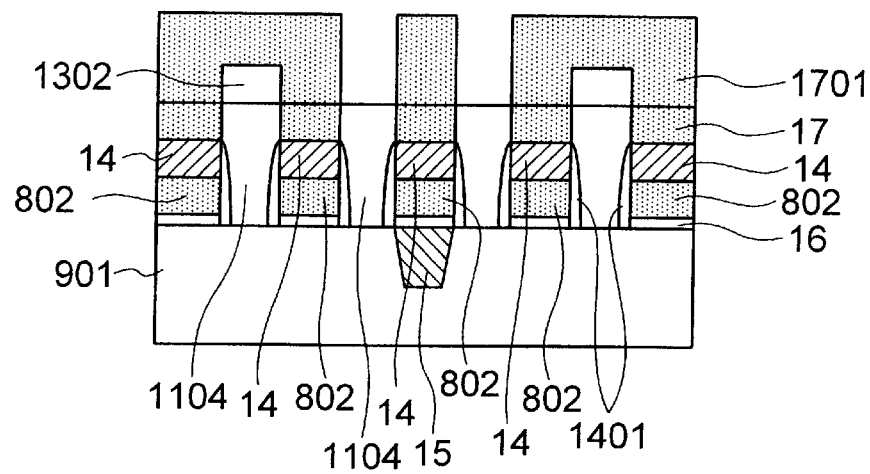
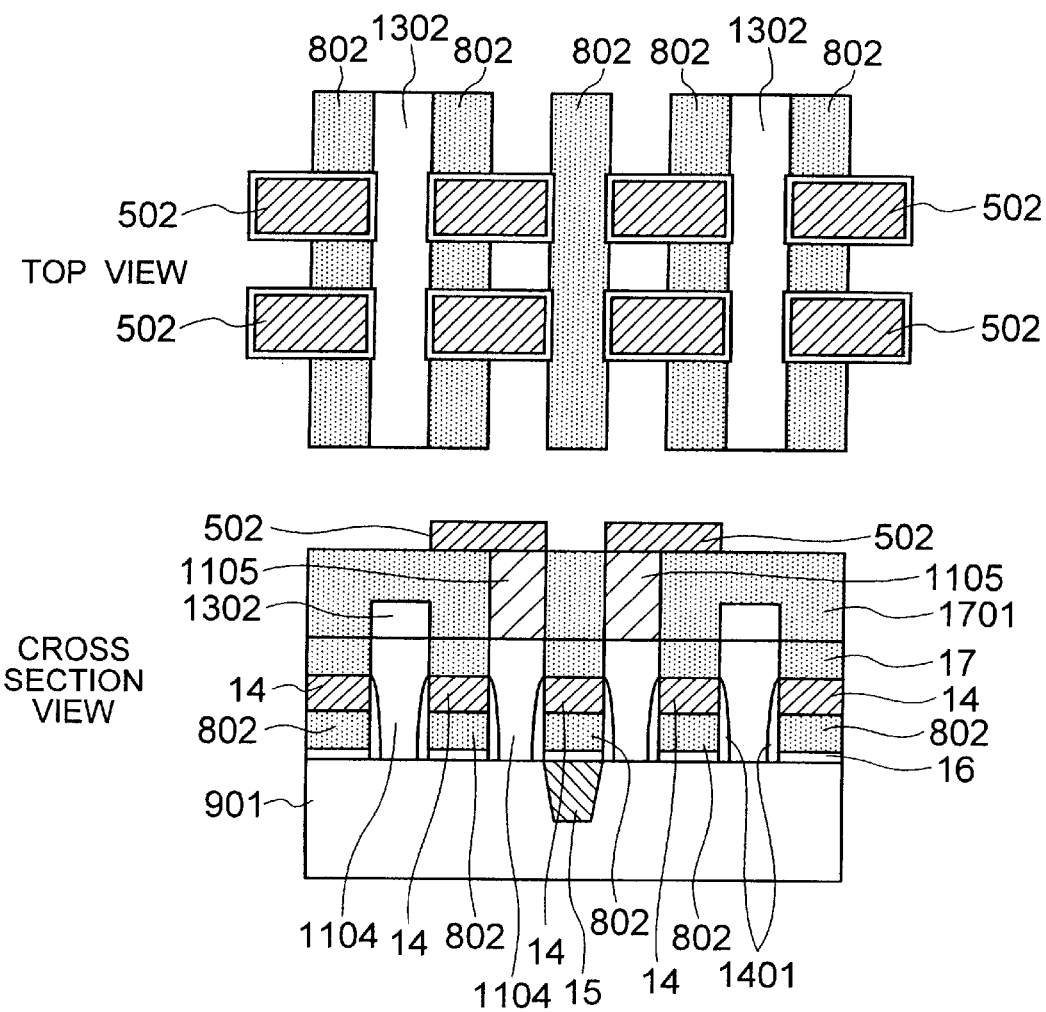

FIG. 19
TOP VIEW
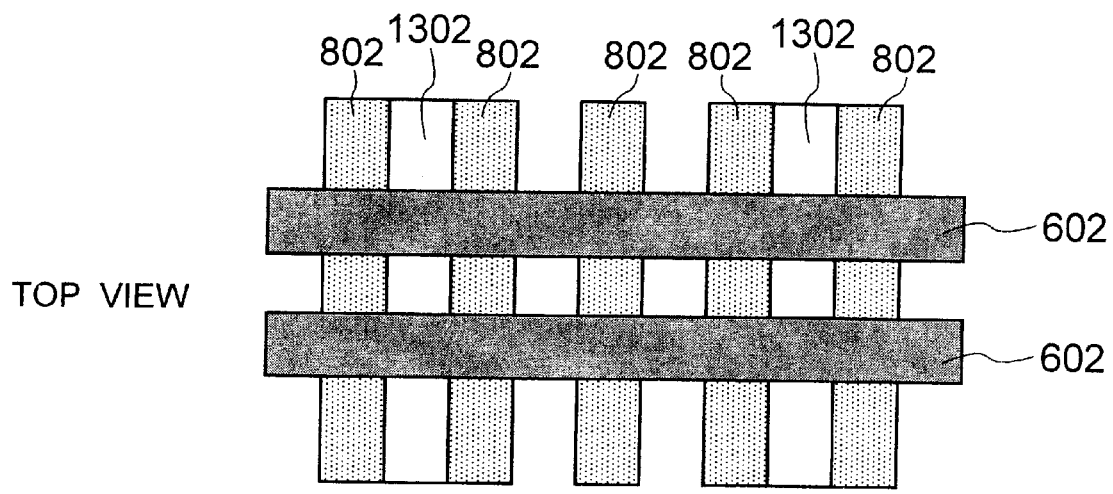
CROSS SECTION VIEW
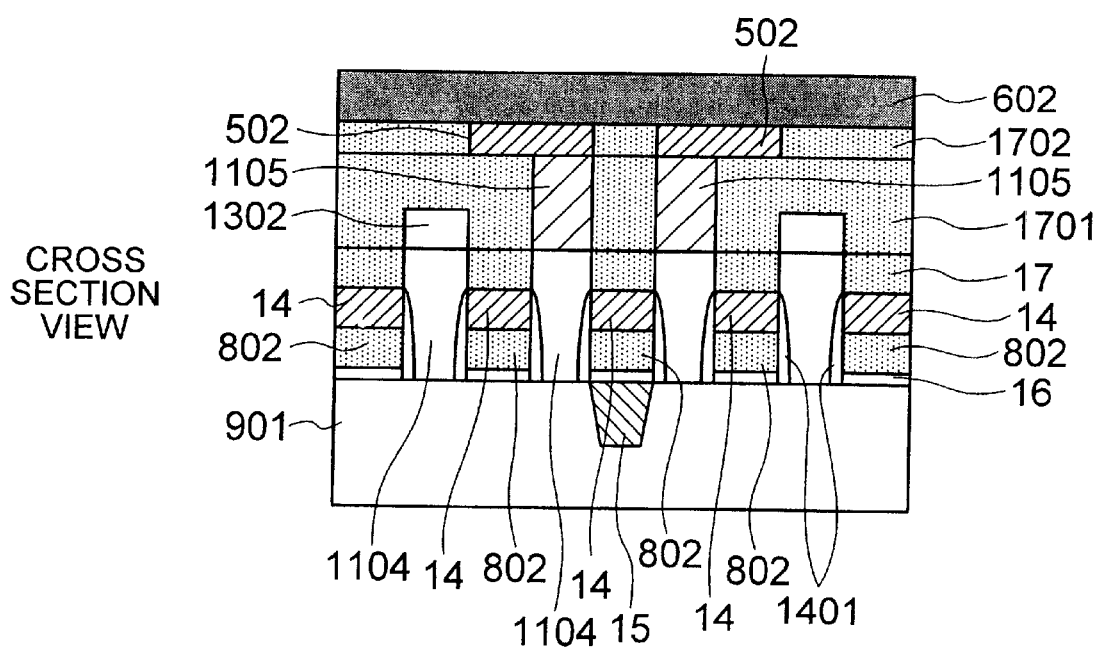

MAGNETIC SEMICONDUCTOR MEMORY APPARATUS AND METHOD OF MANUFACTURING THE SAME

BACKGROUND OF THE INVENTION

1. Field of the Invention

The present invention relates to a semiconductor memory apparatus. More particularly, the present invention relates to a non-volatile random access memory (RAM) having a high speed by utilizing a magneto-resistance effect.

2. Description of the Prior Art

In a dynamic random access memory (DRAM) which has realized an improvement of integration at a rate of four times per three year, a demand thereof is going to be improved more and more hitched to an explosive sale of personal computers in recent years. A mass production of 64 megabit DRAM has passed the peak, and a development intending to achieve a mass production of 256 megabit DRAM using 0.16 µm or less size corresponding to a next-generation micro-fabrication technique has been making progress.

A memory cell from the 16 Kb DRAM to the DRAM produced presently is, as shown in FIG. 1, constituted by a transistor corresponding to a switch and a capacitor accumulating an information electric charge, and is called as 1 transistor cell. In this memory cell, a signal electric voltage read out to a data line is determined on the basis of a ratio between a capacitor capacitance Cs and a parasitic capacitance Cd. Further, since the information electric voltage of the cell is charged to the electric voltage of the data line by reading out the information, it corresponds to a destructive readout, so that a refresh operation corresponding to a rewriting of the data is required.

A greatest problem in the memory cell is to secure a necessary and sufficient capacitor capacitance Cs in two points of view comprising a cell signal electric voltage and a soft error endurance. In order to solve the problem, the memory cell becomes a three-dimensional structure as shown in FIG. 2, and in order to secure a necessary and sufficient accumulating capacity, a height of the capacitor is continuously increased together with a refining. However, the increase of height of the capacitor generates a high step between a memory cell array portion and a peripheral circuit, and significantly reduces a process margin in addition to a lithography, thereby directly causing an increase of manufacturing cost. In the DRAM after 256 Mbit, it is essential that this problem becomes serious more and more. against this background, it is highly expected to provide a memory cell requiring no capacitor in place of the conventional 1 transistor cell.

A magnetic random access memory (MRAM) corresponds to a high speed non-volatile memory utilizing a tunnel magneto resistance (TMR) of a magnetic tunnel junction (MTJ) described later. IBM and Motorola respectively manufactured arrays of 1 Kb and 512 b MRAMs by way of trial and reported a confirmation of memory operations, in International Solid State Circuit Conference 2000 (ISSCC 2000). A description will be briefly given below of a principle of operation of the MRAM. At first, a description will be given of TMR of MTJ corresponding to a base of a memory function. MTJ is structured, for example, such that a thin tunnel insulating film 2 is held between two ferromagnetic layers 1 and 3 as shown in FIG. 3. A tunnel conductance of this structure is in proportion to a product of density of states in a fermi level of two ferromagnetic materials. FIG. 4 shows in a comparative manner a density of states in the case (a) of parallel spin direction of two ferromagnetic materials are parallel to each other and the case (b) of anti-parallel spin direction. Since the directions of the spins are stored before and after tunneling, a tunnel resistance is small in the case of being parallel and on the contrary, it is large in the case of being anti-parallel, as is apparent from FIG. 4. As a result, when fixing the direction of one spin in the magnetic tunnel junction and changing the direction of another spin due to an external magnetic field, it is known that a hysteresis characteristic shown in FIG. 5 appears and a memory is obtained. Since a switching of the spin has an order of nsec, and the direction of the spin is fixed unless the magnetic field is applied, an operation of the high speed non-volatile memory is expected.

FIGS. 6 and 7 respectively show an equivalent circuit of the MRAM announced by IBM and the like and a simplified cross sectional structure. A memory cell is constituted by a selective transistor and a TMR device. Except for the TMR device employed in place of the capacitor, it is similar to the existing DRAM. A primary difference from the DRAM is that surplus word lines 7 and 701 are provided.

In order to clarify the reason, a description will be given of a writing and readout operation in the MRAM shown in FIGS. 6 and 7. At a time of writing, an electric current is applied to bit lines 6 and 601 and the writing word lines 7 and 701, the direction of the spin is written in the selected cell due to a generated total magnetic field. In the non-selected cells, since an applied magnetic field is small, the directions of the spins are not changed. At a time of reading out, readout word lines 8 and 801 are turned on, and it is judged on the basis of the electric current flowing between common ground lines 13 and 1301 and the bit lines 6 and 601 whether "0" or "1" is established.

In the MRAM announced by IBM and the like mentioned above, the writing word lines 7 and 701 are formed below the bit lines 6 and 601, and this structure has the following two problems. One of them is that a process becomes hard, and another of them is that a data writing becomes unstable. This will be described below. FIG. 8 shows a cross sectional view at a time of actually putting the MRAM having the structure shown in FIG. 7 into practice. In this case, there is shown the case that the word line pitch is made minimum, that is, the cell area is made minimum. In the present structure, it is necessary to open a contact with passing through a portion between the writing word lines without electrically shorting with the writing word lines 702 so as to connect plugs 1105 and 1104, and this is hard in view of process. Further, as shown in FIG. 9, since an overlap between the writing word line 702 and the TMR device 502 on a plane at a time of viewing from the above is partly formed, the write magnetic field is not uniformly applied to a whole of the TMR device 502, and it becomes unstable to write the data. These two problems are both generated by a reason that the writing word line 702 is formed below the bit line 602.

SUMMARY OF THE INVENTION

In order to solve the problem mentioned above, in accordance with an embodiment of the present invention, there is provided an MRAM structure in which a writing word line is formed above a bit line. The present structure solves two problems mentioned above increasing a cell area.

In accordance with the present invention, in addition to having the structure of the MRAM in which the writing word line is formed above the bit line, it is possible to form a plug connected to a TMR device without applying a self-aligned contact opening process. This is easy in view of process in comparison with the case mentioned above. Further, since a restriction of layout of the writing word line is reduced, the writing word line can cover the TMR device at a time of viewing from the above. This is advantageous in a point of view of a stability for writing the data.

BRIEF DESCRIPTION OF THE DRAWINGS

FIG. 17 is a cross sectional view in a direction vertical to the word line in 1 manufacturing process of the semiconductor memory apparatus in accordance with the present invention;

FIG. 18 is a top elevational view in 1 manufacturing process of the semiconductor memory apparatus in accordance with the present invention and a cross sectional view in a direction vertical to the word line;

FIG. 19 is a top elevational view in 1 manufacturing process of the semiconductor memory apparatus in accordance with the present invention and a cross sectional view in a direction vertical to the word line;

DESCRIPTION OF THE PREFERRED EMBODIMENTS

Emibodiment 1

Figure 1:
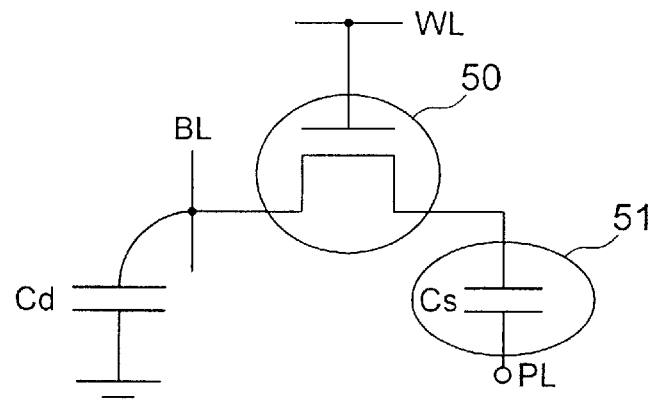
FIG. 1 is a view of an equivalent circuit in a conventional 1 transistor memory cell.
Figure 2:
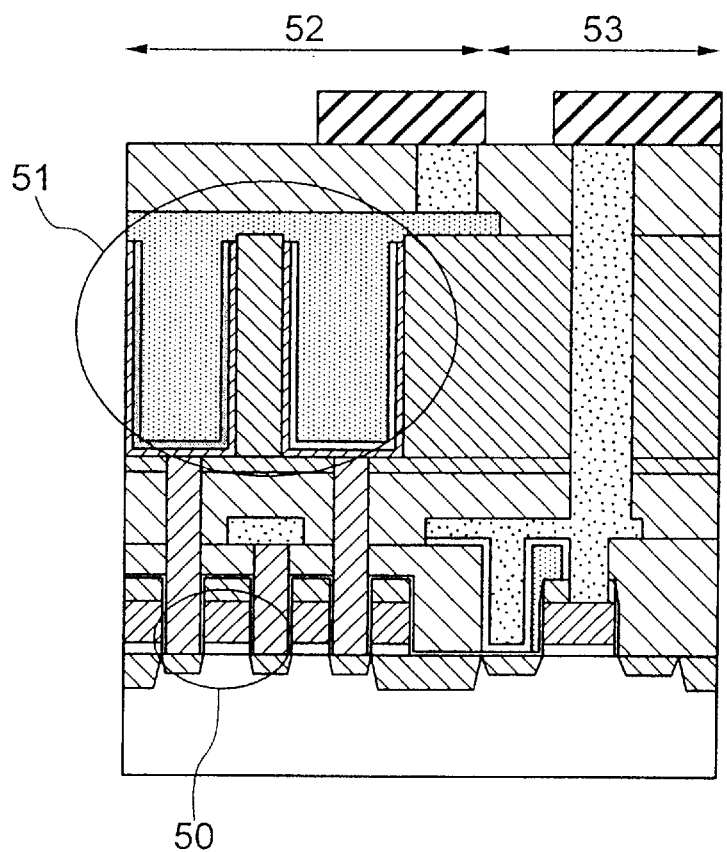
FIG. 2 is a cross sectional view of a semiconductor memory apparatus having the conventional 1 transistor memory cell.
Figure 3:
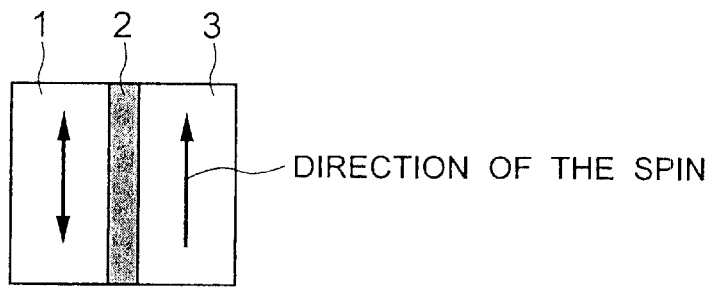
FIG. 3 is a view of a structure of a magnetic tunnel junction (MTJ)
Figure 4A:
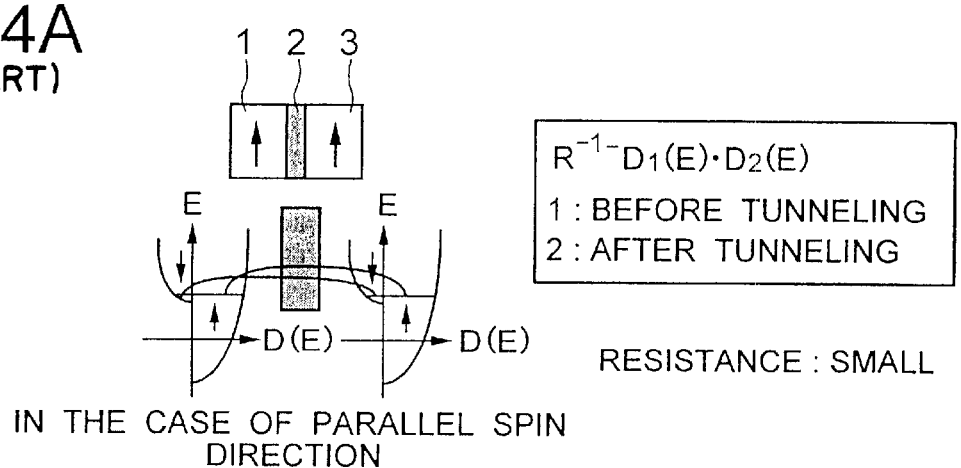
FIG. 4A is a view of a density of states in the case of parallel spin direction in the MTJ.
Figure 4B:
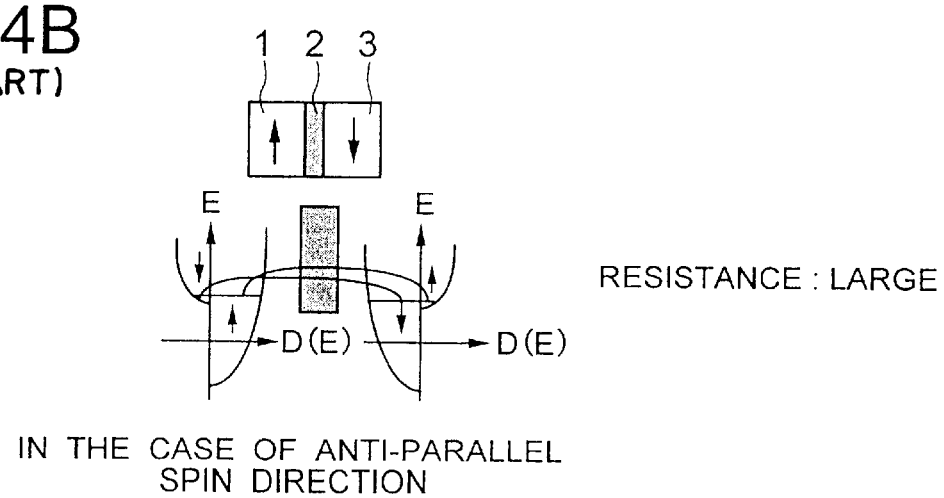
FIG. 4B is a view of a density of states in the case of anti-parallel spin direction in the MTJ.
Figure 5:
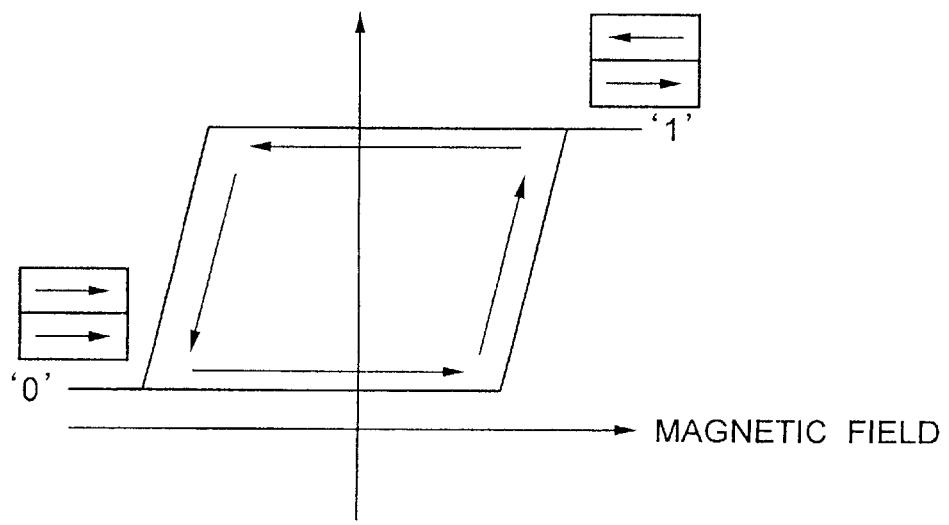
FIG. 5 is a view of a magnetic field dependency of a tunnel resistance.
Figure 6:
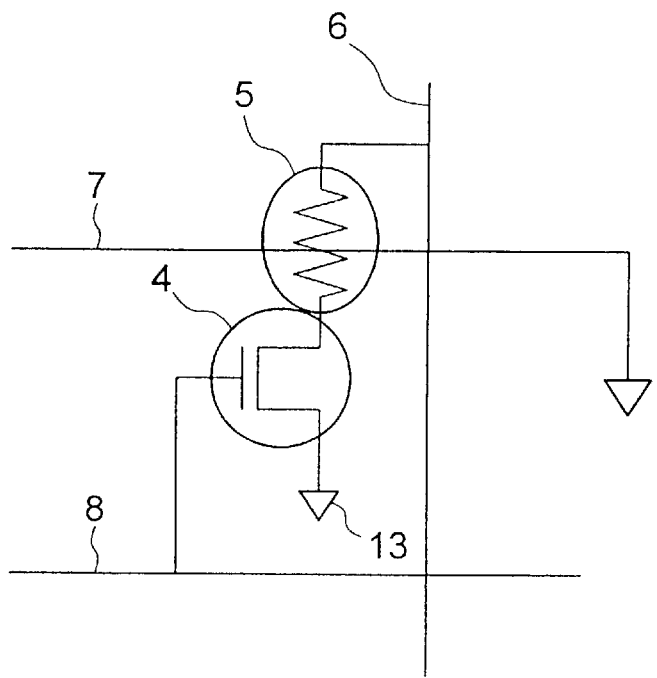
FIG. 6 is a view of an equivalent circuit in an MRAM memory cell.
Figure 7:
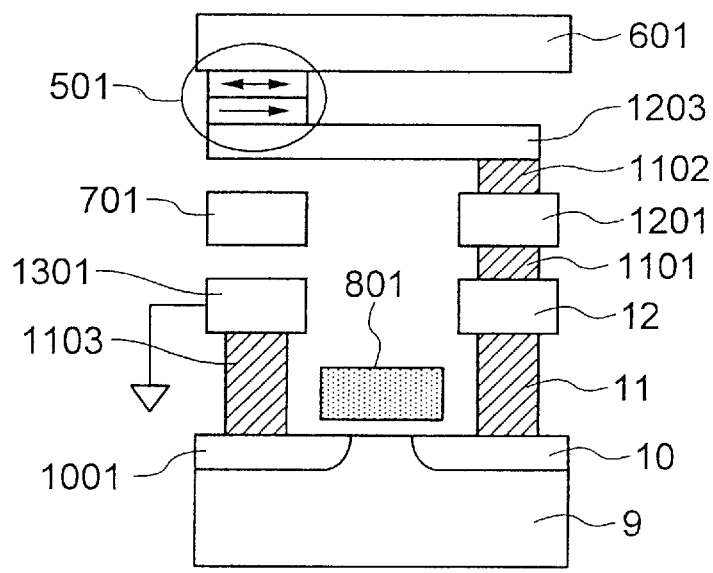
FIG. 7 is a view of a conventional MRAM memory cell structure.
Figure 8:
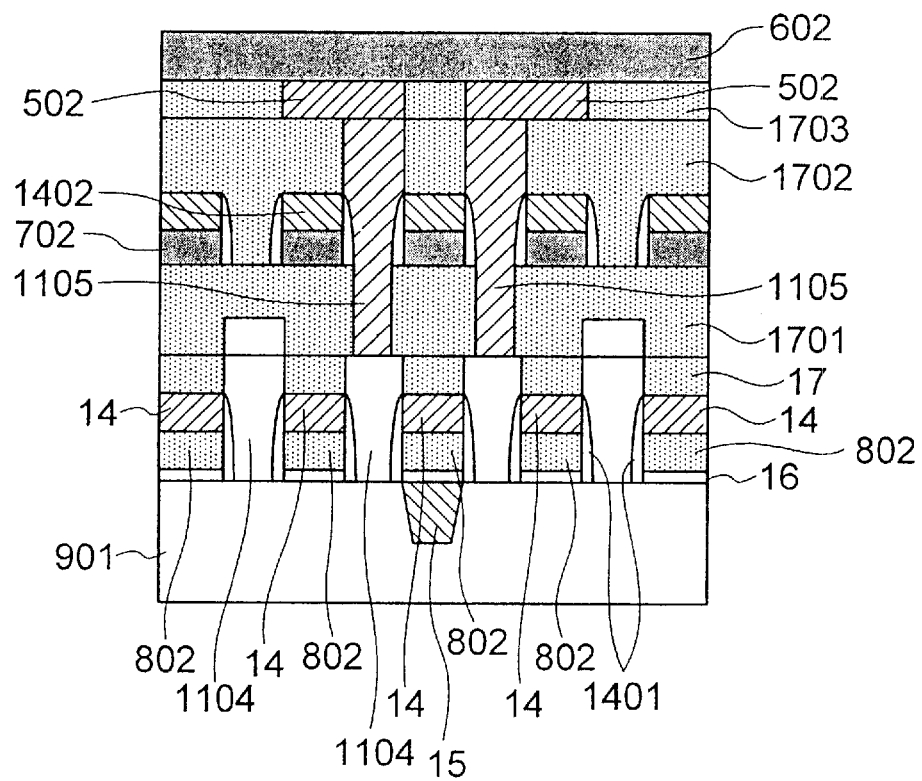
FIG. 8 is a cross sectional view of the conventional MRAM memory cell.
Figure 9:
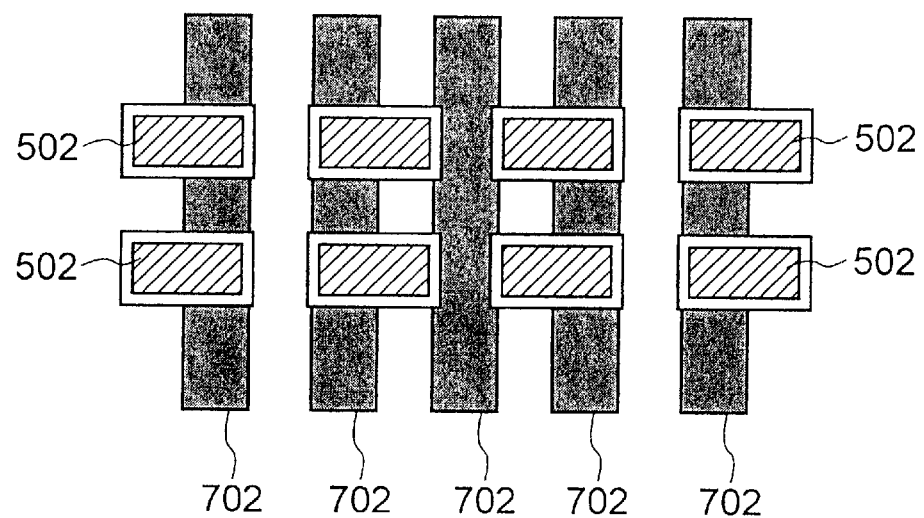
FIG. 9 is a top elevational view showing an arrangement of a TMR device and a writing word line in the conventional MRAM.
Figure 10:
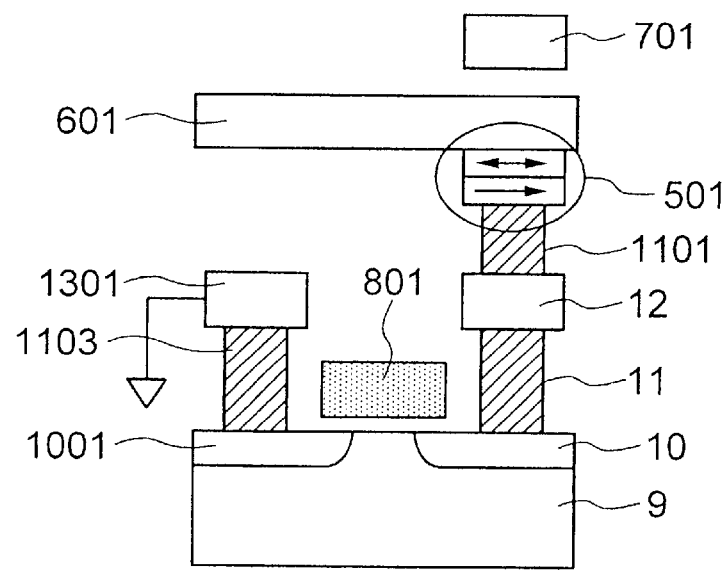
FIG. 10 is a brief view of an MRAM memory cell structure in accordance with an embodiment of the present invention.

A brief structure of the present invention is as shown in FIG. 10, however, in accordance with the present embodiment, in an MRAM constituted by a selective transistor and a TMR device, there is shown a structure relating to a method of manufacturing a semiconductor memory apparatus in which a writing word line is formed below a data line. A transistor employs a normal transistor formed on a Si substrate surface. A description will be in detail given below of the structure while following to the manufacturing process.

Figure 13:
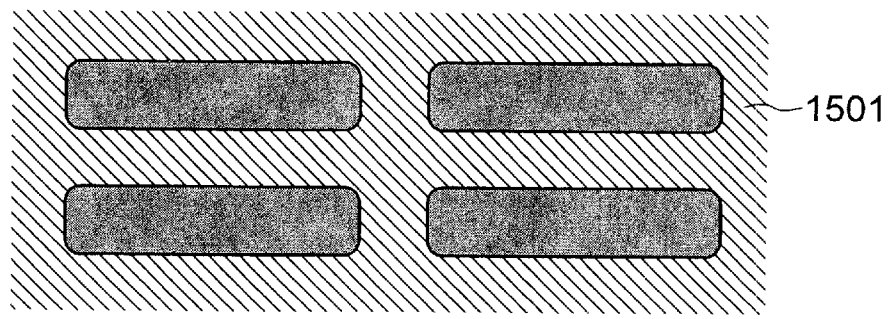
FIG. 13 is a top elevational view in 1 manufacturing process of the semiconductor memory apparatus in accordance with the present invention.
Figure 14:
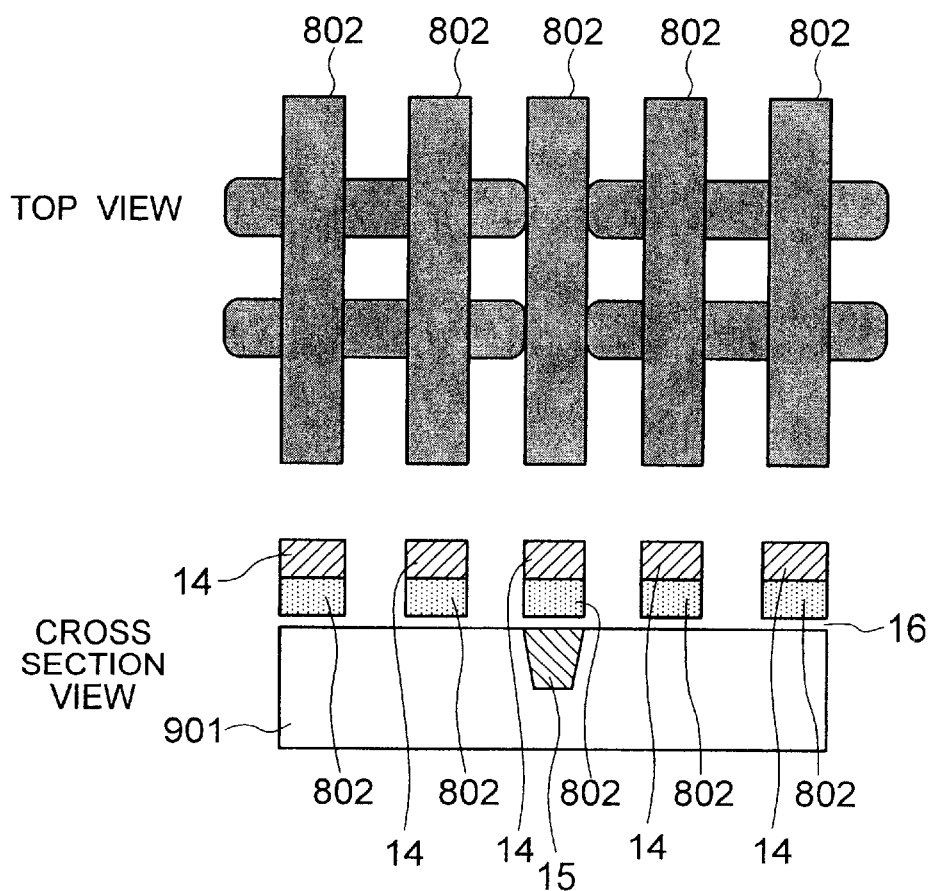
FIG. 14 is a top elevational view in 1 manufacturing process of the semiconductor memory apparatus in accordance with the present invention and a cross sectional view in a direction vertical to the word line.

At first, a p-type semiconductor substrate 901 is prepared, and an area separating between devices 1501 for separating MOSFET is formed by using a known selective oxidation method and a shallow grooved isolation. FIG. 13 shows a plan layout of a device separation area of a memory array portion. In the present embodiment, there is employed the shallow grooved isolation capable of flattening a surface. Accordingly, at first, a separation groove having a depth of about 0.3 micron is formed on the substrate by using a known dry etching method, damages on groove side walls or a bottom surface caused by the dry etching are removed, thereafter Si oxide films are accumulated with a thickness of about 0.7 micron by using a known chemical vapor deposition (CVD) method, the oxide films existing in the other portion than the groove are selectively polished in accordance with a known chemical mechanical polishing (CMP) method, and the oxide films buried in the groove are left. Next, two different conductive wells are formed by a high energy ion implantation. Next, after cleaning the surface of the semiconductor substrate, a gate oxide film 9 is grown in accordance with a thermal oxidation method. A polycrystal line silicon containing phosphorous of high concentration is accumulated on the surface of the oxide film, as a word line 802 and a gate electrode at a thickness of 100 nm. Of course, a polycrystal line silicon containing boron of high concentration in place of phosphorous may be used. In the present embodiment, the polycrystal line silicon is used as an electrode material, however, in order to reduce a gate resistance, it is of course possible to use a laminated film constituted by a metal and a polycrystal line silicon between which a barrier metal for restricting a reaction is provided. Further, a silicide film which does not react with the polycrystal line silicon may be used as this metal. Further, a silicon ticker film 14 is accumulated at 100 nm. Next, in accordance with the dry etching method, the gate electrode is formed in a peripheral circuit area, and the word line 802 is formed in the memory array as shown in FIG. 14. Further, the gate electrode and a resist are formed as a mask and impurity ions are struck, whereby a diffusion layer is formed.

Figure 15:
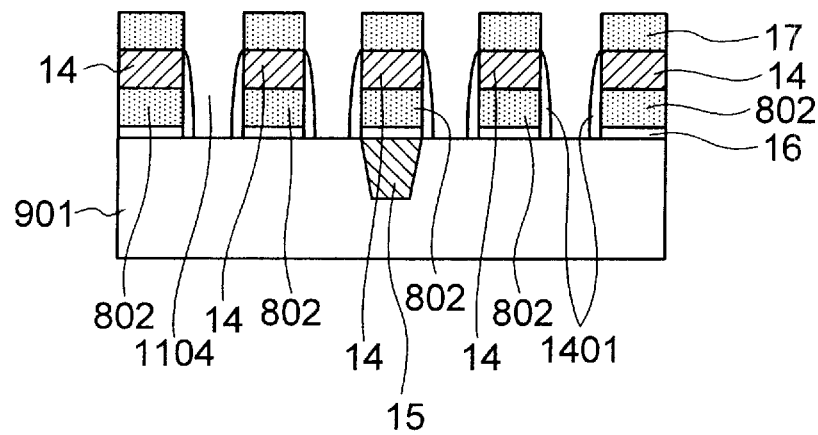
FIG. 15 is a cross sectional view in a direction vertical to the word line in 1 manufacturing process of the semiconductor memory apparatus in accordance with the present invention.

Next, in order to apply a self-aligned contact opening process, the silicon ticker films 1401 having a thickness of 50 nm are accumulated. Further, the oxide films 17 having a thickness of about 0.7 micron are accumulated, a flattening in accordance with a known CMP method is executed, the silicon oxide film is etched under a condition having a high selective ratio with respect to the silicon ticker film (the self-aligned contact opening process), and in the memory array, a contact hole is opened as shown in FIG. 15.

Figure 16:
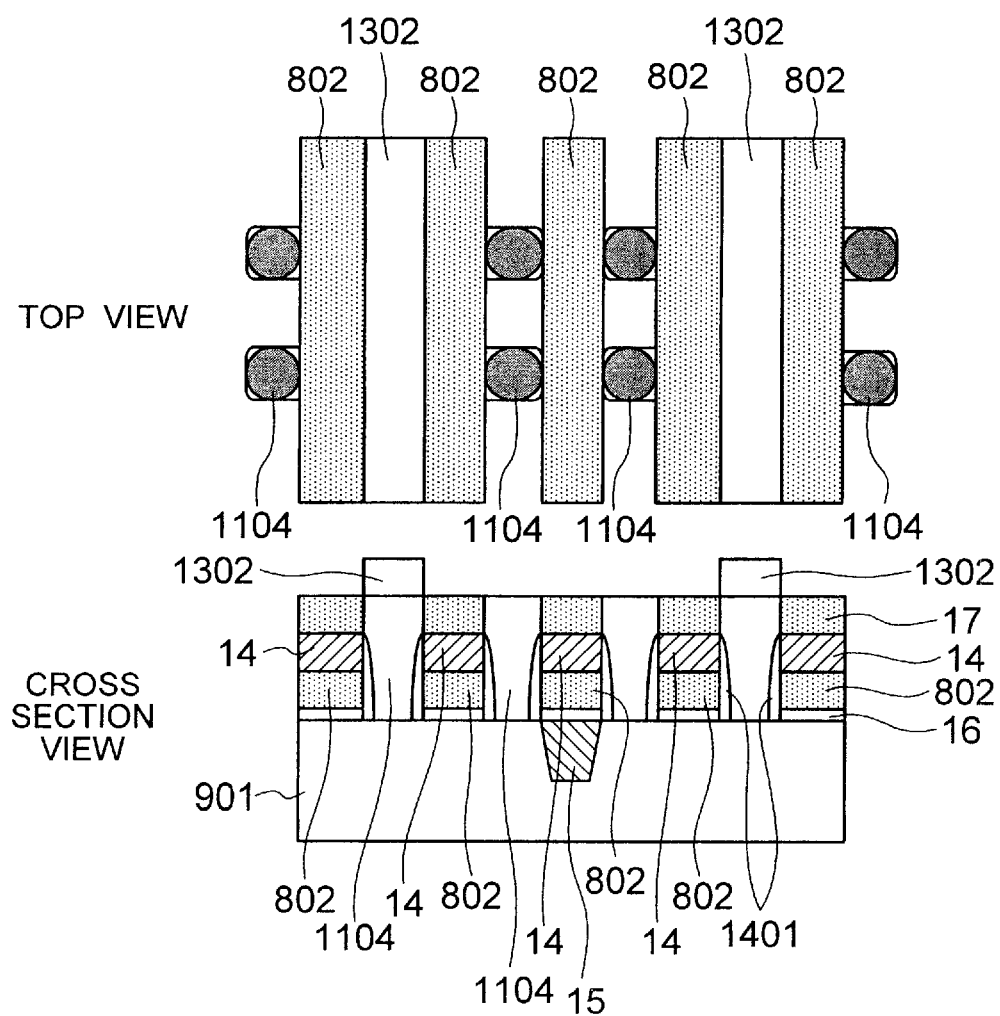
FIG. 16 is a top elevational view in 1 manufacturing process of the semiconductor memory apparatus in accordance with the present invention and a cross sectional view in a direction vertical to the word line.

Further, the polycrystal line silicon doping the impurity at a high concentration in accordance with the known CVD method is accumulated, and a conductive plug 1104 is formed by using the known CMP method. Further, tungsten forming a common ground line 1302 is accumulated at 100 nm and is processed so as to extend in parallel to the word line as shown in FIG. 16. The tungsten forms a metal first wiring layer in the peripheral circuit.

Next, the oxide film 1701 having a thickness of about 0.7 micron is accumulated in accordance with the conventional CVD method, the flattening in accordance with the known CMP method is executed, the contact is opened and the memory array is made as shown in FIG. 17. In this case, as is apparent from FIG. 17, it is not necessary to use the self-aligned contact opening process, and it is easy in view of the process. Next, the polycrystal line silicon plug 1105 is formed in accordance with the known process. Of course, the tungsten may be employed in place of the polycrystal line silicon. Further, a laminated film of NiFe/Al$_2$O$_3$/CoFe forming the TMR device 502 is accumulated, is processed to a desired shape and is formed as shown in FIG. 18. Next, after a film between the layers 1702 is accumulated and is flattened in accordance with the CMP method, the tungsten forming the bit line 602 is accumulated at 100 nm and is processed. A state at this time is shown in FIG. 19.

Figure 11:
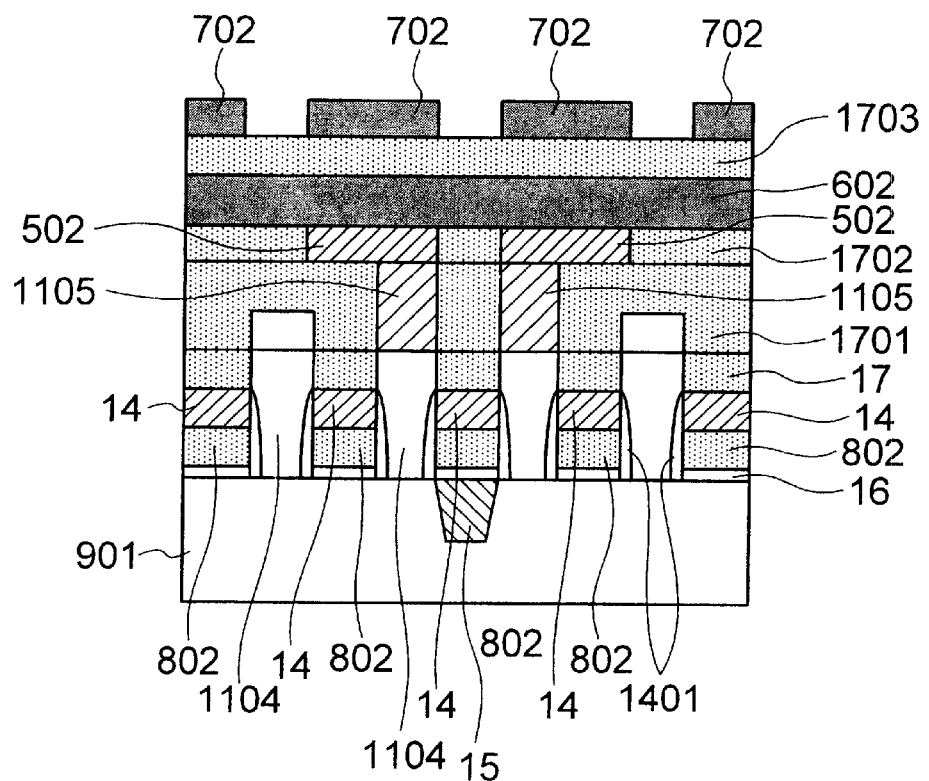
FIG. 11 is a cross sectional view in a direction parallel to a bit line in 1 manufacturing process of a semiconductor memory apparatus in accordance with the present invention.
Figure 12:
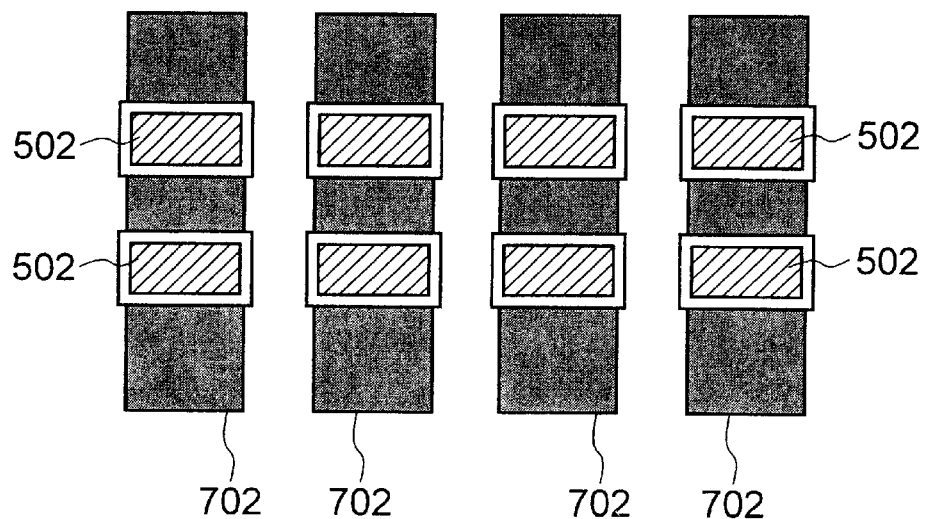
FIG. 12 is a top elevational view showing an arrangement of a TMR device and a writing word line in the MRAM in accordance with the present invention.

Next, an insulating film between the layers 1703 is accumulated, and the tungsten forming the writing word line 702 is accumulated at 100 nm and is processed. This state is shown in FIG. 11. Since the writing word line 702 is formed in a top layer, no restriction exists with respect to a layout, and as shown in FIG. 12, it is possible to arrange so as to completely cover the TMR device 502 two-dimensionally. This is a great characteristic in a point of view of a reliability of a memory operation. Finally, two layers of metal wires are formed so as to obtain a desired semiconductor memory apparatus.

Embodiment 2

The present embodiment corresponds to a structure of making the writing transistor in the memory cell of the MRAM in a vertical type. As a great characteristic of the present embodiment, there can be listed up that it is possible to make the cell area 4F2 corresponding to about half of the normal DRAM.

Figure 20:
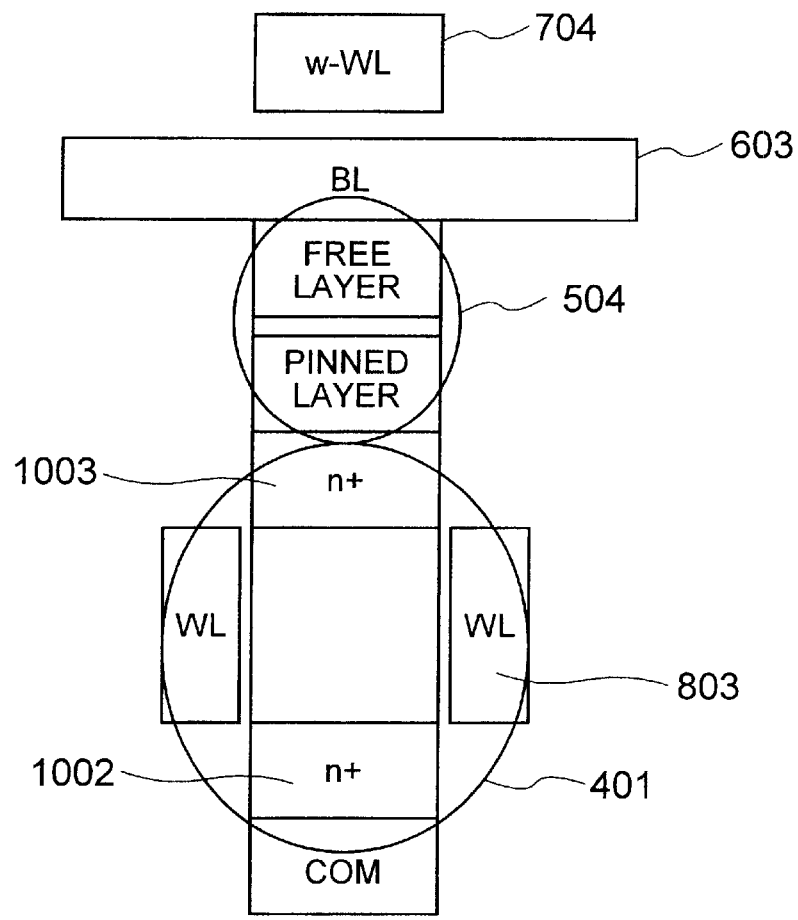
FIG. 20 is a view showing a structure of a semiconductor memory apparatus in accordance with the present invention.

The structure realized by the present embodiment is as shown in FIG. 20. That is, the diffusion layer 1003 of the vertical selective transistor 401 is connected to the TMR device 504, and the TMR device 504 is connected to the bit line 603. The writing word line 704 is formed thereabove. A description will be in detail given below while following the manufacturing process.

Figure 21:
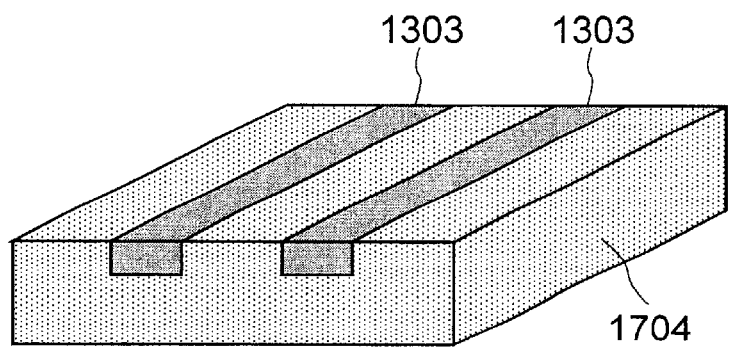
FIG. 21 is a bird's eye view in 1 manufacturing process of the semiconductor memory apparatus in accordance with the present invention.
Figure 22:
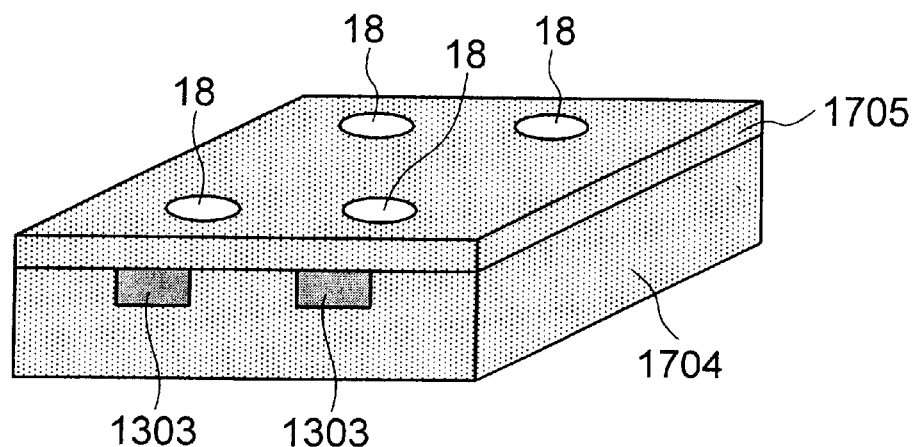
FIG. 22 is a bird's eye view in 1 manufacturing process of the semiconductor memory apparatus in accordance with the present invention.

At first, the transistor in the peripheral circuit is formed in accordance with the normal manufacturing process. The contact plug is formed after accumulating the insulating film between-the layers 1704, and a first metal wiring layer constituted by the tungsten is formed. In the memory array, the wiring layer is used as the common ground line 1303. FIG. 21 shows a state at this time. Next, the insulating film between the layers is accumulated, the polycrystal line silicon plug containing the impurity at a high concentration is formed and the structure is formed as shown in FIG. 22.

Figure 23:
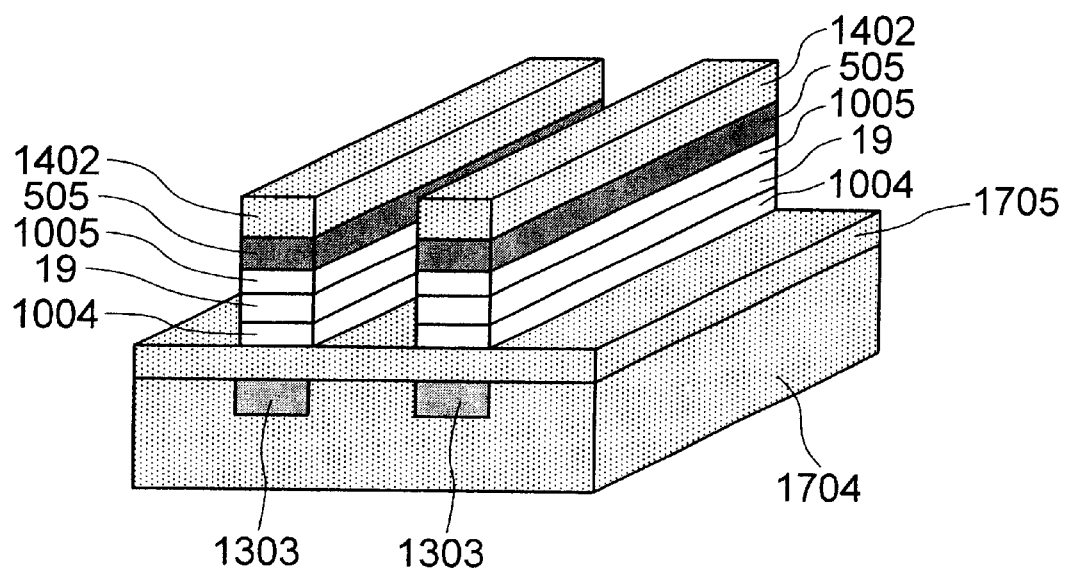
FIG. 23 is a bird's eye view in 1 manufacturing process of the semiconductor memory apparatus in accordance with the present invention.
Figure 24:
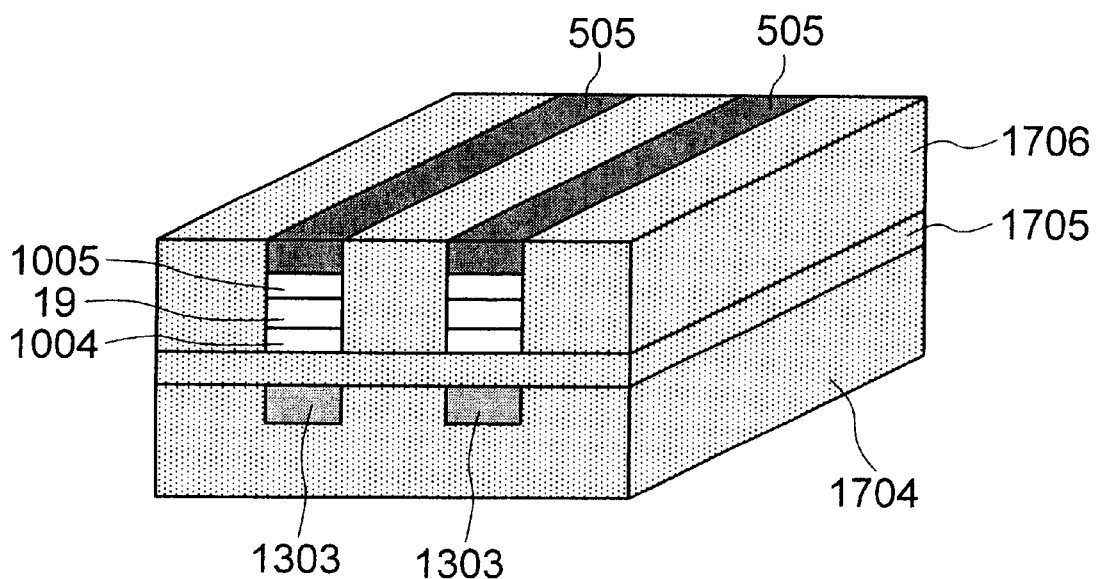
FIG. 24 is a bird's eye view in 1 manufacturing process of the semiconductor memory apparatus in accordance with the present invention.

Next, the vertical transistor and the TMR portion are formed. In this case, the films are accumulated in the following order. At first, N+ layer (1004) doping the impurity forming the diffusion layer of the vertical transistor at a high concentration, a low concentration impurity layer (19) forming a channel portion and N+ layer (1005) forming the diffusion layer are accumulated. These form the transistor portion. Of course, at this time, the polycrystal line silicon mentioned above can be made a single crystal by using a method such as a laser anneal or the like. In this case, it goes without saying that a performance of the transistor is improved. Further, NiFe, $Al_2O_3$ and CoFe are accumulated in this order as the films constituting the TMR device 505. Further, as a stopper mask of the CMP, a plasma SiN 1402 is accumulated at 100 nm. Since the plasma SiN is used, there is an advantage that it is possible to reduce a thermal load applied to the TMR device. The laminated layer is processed in a simple line and space shape as shown in FIG. 23. Sequentially, the insulating film between the layers 1706 is accumulated, the flattening is executed by the CMP, and CoFe forming the TMR is exposed. A state at this time is shown in FIG. 24.

Figure 25:
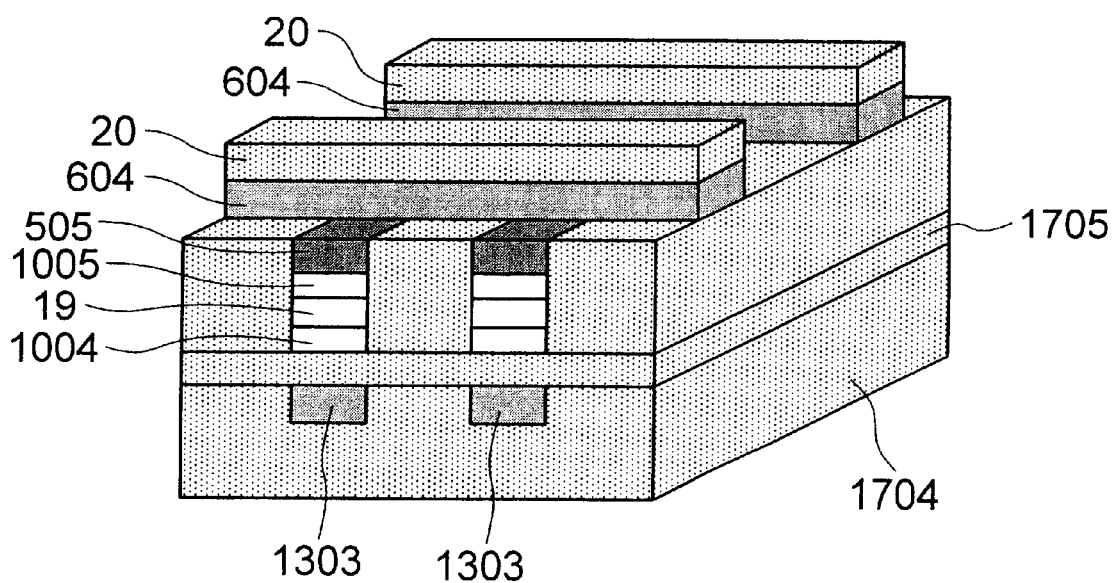
FIG. 25 is a bird's eye view in 1 manufacturing process of the semiconductor memory apparatus in accordance with the present invention.

Next, the tungsten having a film thickness of 100 nm and forming the bit line 604 and the plasma oxide film 20 are accumulated. Sequentially, as shown in FIG. 25, it is processed in the line and space shape which is previously formed and extends in a direction vertical to the common line. In accordance with this process, the bit line 604 and the TMR device 505 are electrically connected. In this case, in accordance with the present embodiment, for the purpose of reducing a capacity between the bit lines, a width of the bit line is made narrow. In particular, an ashing process is applied after exposing a bit line resist pattern.

Figure 26:
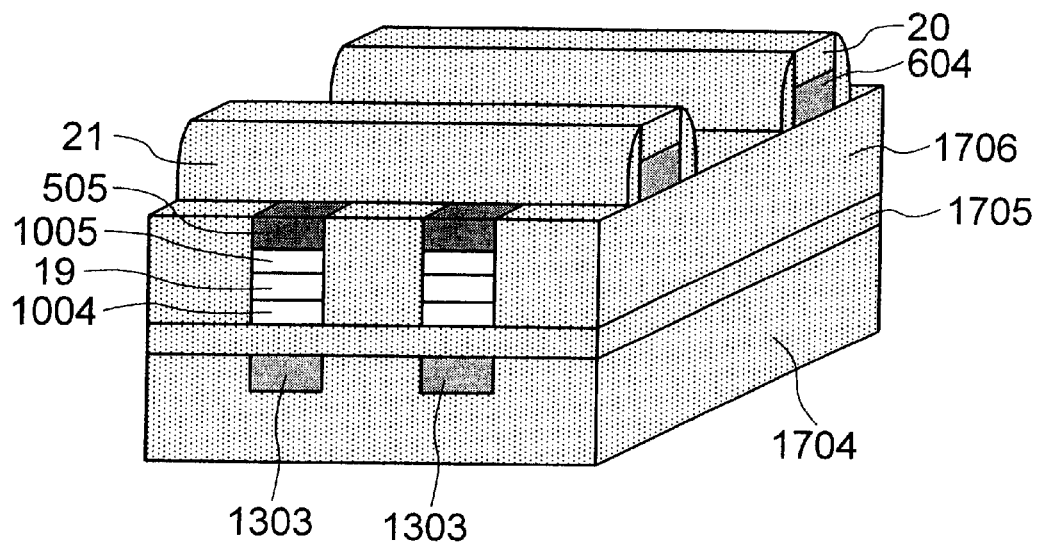
FIG. 26 is a bird's eye view in 1 manufacturing process of the semiconductor memory apparatus in accordance with the present invention.
Figure 27:
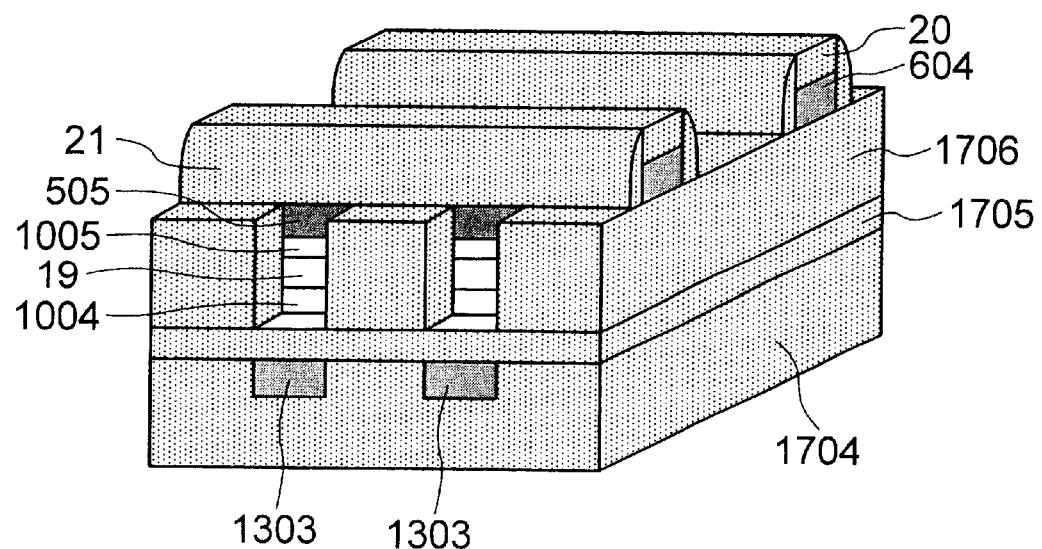
FIG. 27 is a bird's eye view in 1 manufacturing process of the semiconductor memory apparatus in accordance with the present invention.

Next, the word line of the selective transistor is formed. At first, for the purpose of preventing the word line and the bit line 604 from being electrically shorted, as shown in FIG. 26, a side wall oxide film 21 is formed in the bit line 604. Further, the bit line 604 covered by the oxide film is formed as the mask and the ground laminated film is etched in a self-aligned manner, whereby the structure shown in FIG. 27 is obtained.

Figure 28:
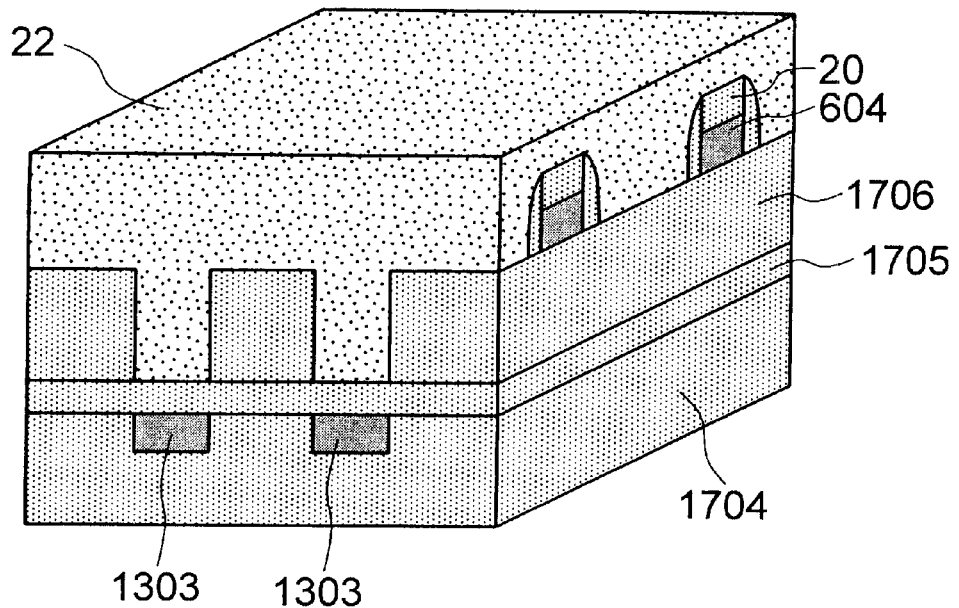
FIG. 28 is a bird's eye view in 1 manufacturing process of the semiconductor memory apparatus in accordance with the present invention.
Figure 29:
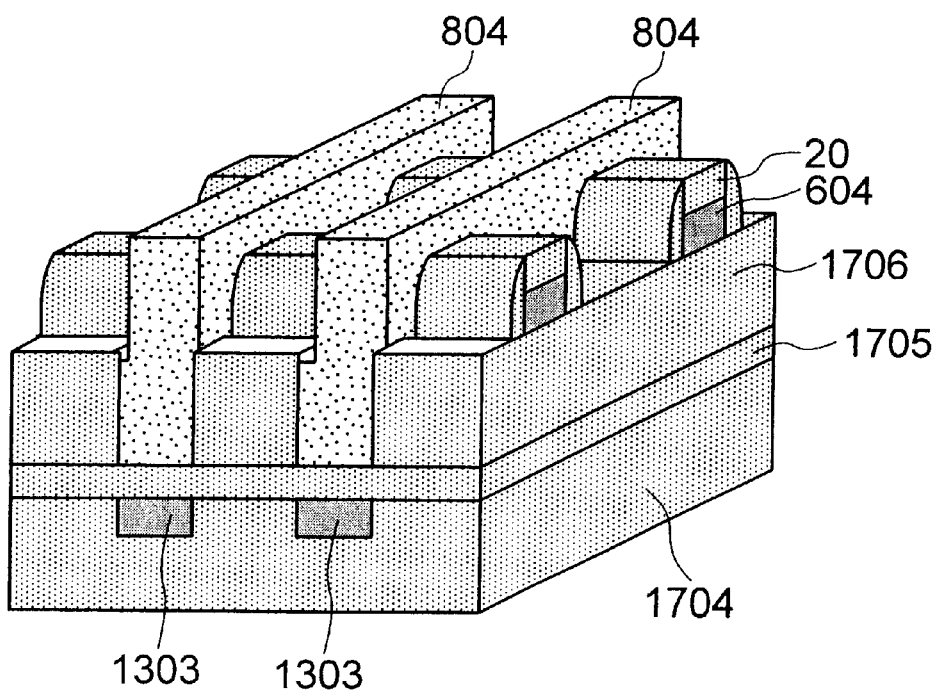
FIG. 29 is a bird's eye view in 1 manufacturing process of the semiconductor memory apparatus in accordance with the present invention.

Sequentially, the gate oxide film having a film thickness of 10 nm is formed, the tungsten forming the word line is further accumulated and flattened and the structure shown in FIG. 28 is obtained. In the present embodiment, the tungsten is used, however, it is of course possible to use a laminated film constituted by the tungsten and the polycrystal line silicon between which the barrier metal is held, the polycide or the like. Next, the tungsten is processed in the line and space shape extending in the direction vertical to the bit line in accordance with the normal dry etching method. The state at this time is shown in FIG. 29. As an effect of flattening the electrode material at a time of processing the word line 804, an etching step becomes only a height of the bit line. In FIG. 29, it corresponds to a step adding the height of the bit line 604 to the height of the cap oxide film 20. In this case, in accordance with the present embodiment, the word line 804 of the selective transistor can be used as the writing word line. At this time, at a time of writing the data, the structure is made such that no surplus electric current flows, by applying an electric potential difference equal to or less than a threshold electric voltage of the selective transistor to both ends of the word line.

Finally, a necessary metal wire layer is formed and a desired semiconductor apparatus is obtained. In the present embodiment, a semiconductor memory apparatus having a minimum cell area can be realized by using the vertical transistor. Further, a simplification of the process and a reduction of the cost can be achieved by making the gate electrode of the selective transistor and the writing word line common.

In the present embodiment, the writing word line and the readout word line are made common, however, can be of course independent from each other. In this case, from the state shown in FIG. 29, the desired writing word line may be formed by using the normal process after accumulating the insulating film between the layers.

Embodiment 3

The present embodiment relates to an MRAM having a vertical selective transistor in the same manner as that of the embodiment 2. A great difference from the embodiment 2 is a thermal load applied to the TMR device. That is, in the embodiment 2, the gate oxidation is executed after forming the TMR device, however, in the present embodiment 3, the TMR device is formed after forming the gate oxide film. As a result, in accordance with the present embodiment, it is possible to reduce the thermal load applied to the TMR device so as to prevent the characteristic thereof from being deteriorated. Since a heat resistance of the TMR device is about 400° C., this is a great characteristic of the present embodiment. A description will be in detail given below of the present embodiment while following the manufacturing process.

Figure 30:
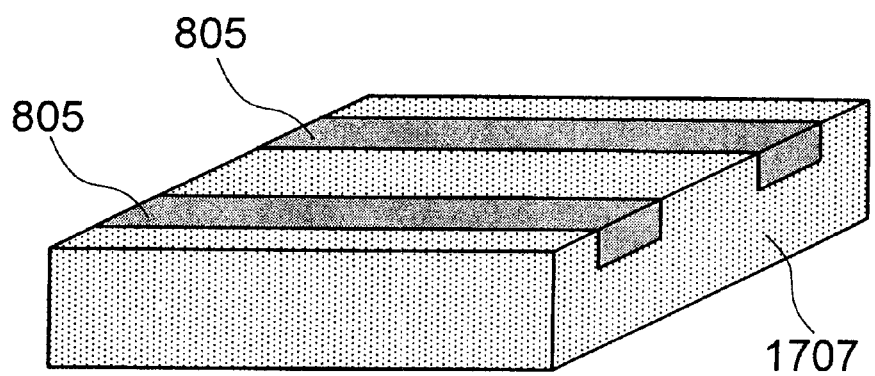
FIG. 30 is a bird's eye view in 1 manufacturing process of the semiconductor memory apparatus in accordance with the present invention.

In the present embodiment, the first metal wire layer in the peripheral circuit is used as the word line 805 of the selective transistor in the memory array. A state in the memory array at this time will be shown in FIG. 30. In this case, in FIG.

Figure 31:
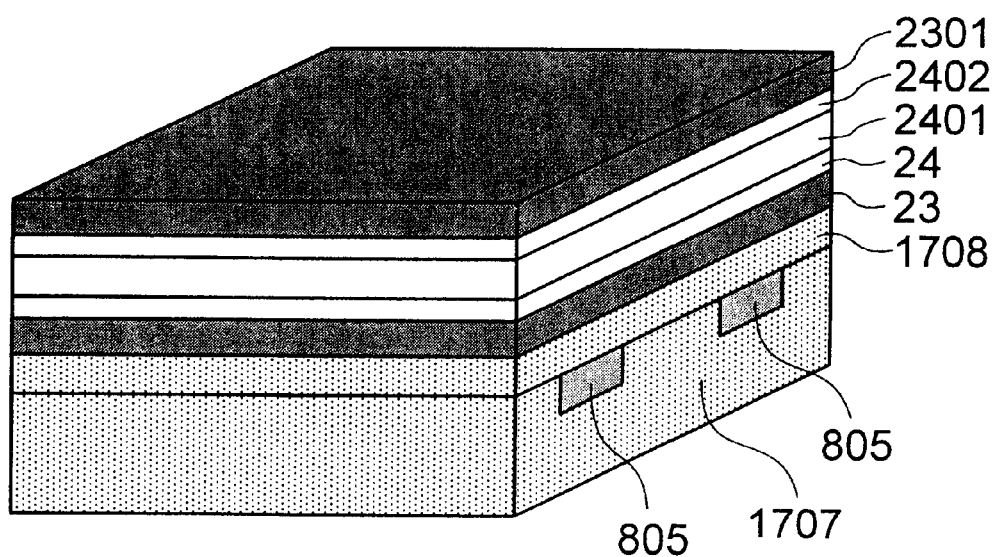
FIG. 31 is a bird's eye view in 1 manufacturing process of the semiconductor memory apparatus in accordance with the present invention.
Figure 32:
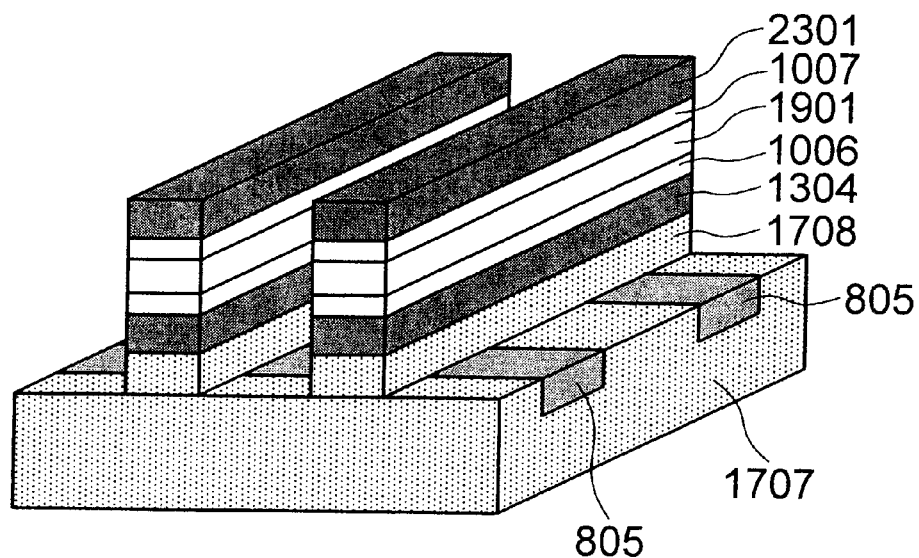
FIG. 32 is a bird's eye view in 1 manufacturing process of the semiconductor memory apparatus in accordance with the present invention.

30, the transistor and the like formed within the substrate are not described. Sequentially, for the purpose of preventing the common ground line and the word line 805 which are formed later from being electrically shorted, the insulating film between the layers 1708 is accumulated at 50 nm. Next, the tungsten 23 forming the common ground line is accumulated at 50 nm. Further, the N+ layer 24 containing the impurity at a high concentration, the low concentration layer 2401 forming the channel and the N+ layer 2402 containing the impurity at a high concentration which form the vertical transistor, are accumulated in this order. Of course, at this time, the polycrystal line silicon mentioned above can be made a single crystal by using the method such as the laser anneal or the like. In this case, it goes without saying that the performance of the transistor is improved. The tungsten 2301 forming the plug for connecting the diffusion layer of the selective transistor and the TMR device later is accumulated thereon. The state at this time is shown in FIG. 31. Next, the laminated film is processed in the line and space shape extending in the direction vertical to the previously formed word electrode 805, and the structure shown in FIG. 32 is obtained.

Figure 33:
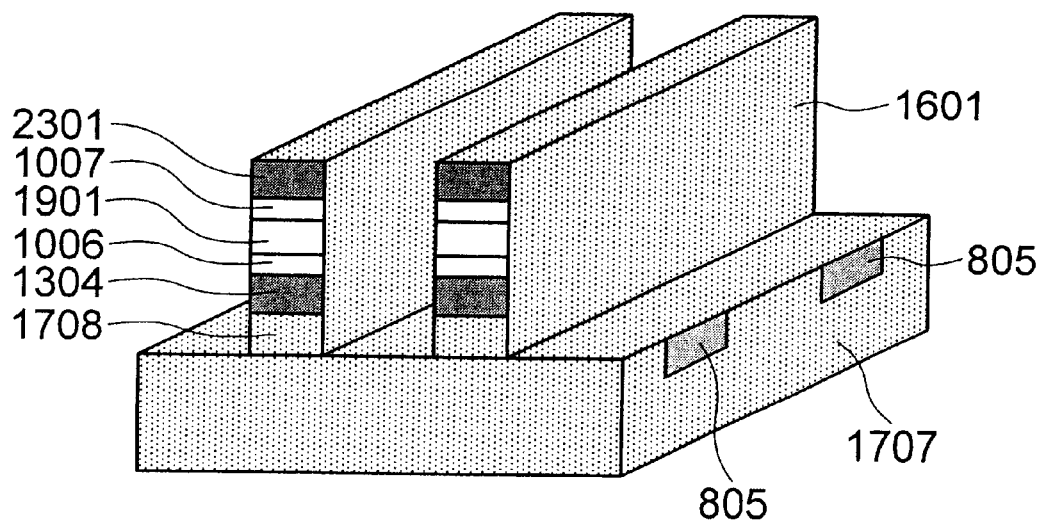
FIG. 33 is a bird's eye view in 1 manufacturing process of the semiconductor memory apparatus in accordance with the present invention.
Figure 34:
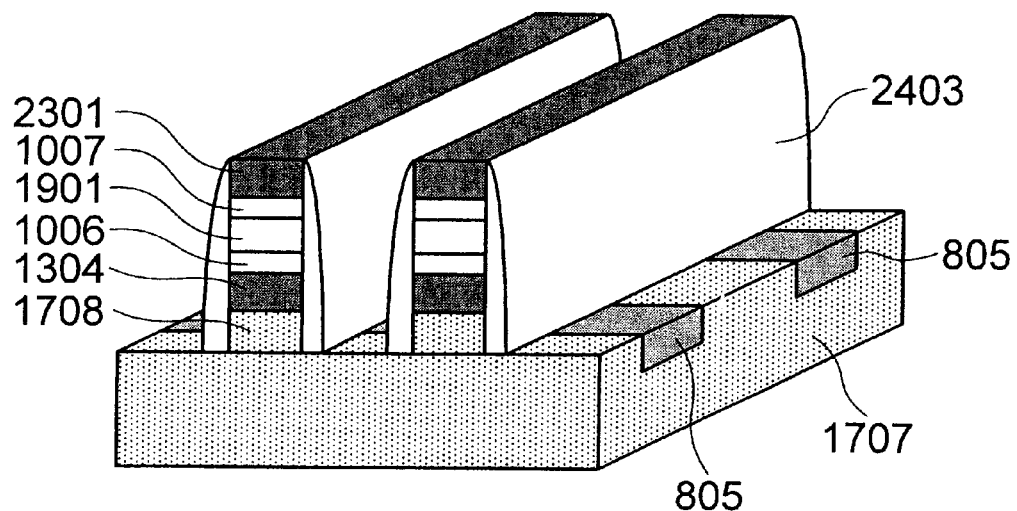
FIG. 34 is a bird's eye view in 1 manufacturing process of the semiconductor memory apparatus in accordance with the present invention.
Figure 35:
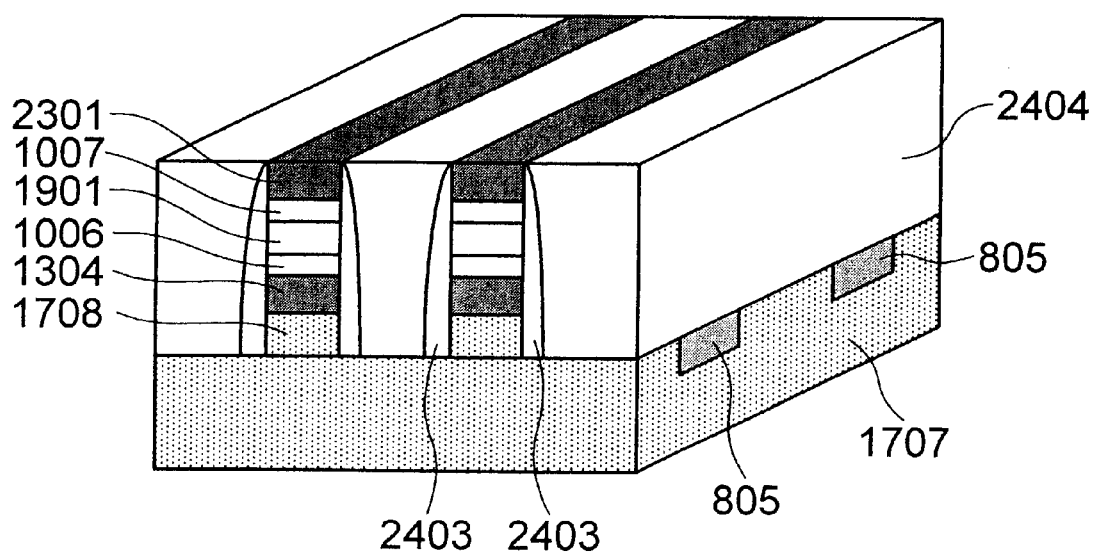
FIG. 35 is a bird's eye view in 1 manufacturing process of the semiconductor memory apparatus in accordance with the[]present invention.
Figure 36:
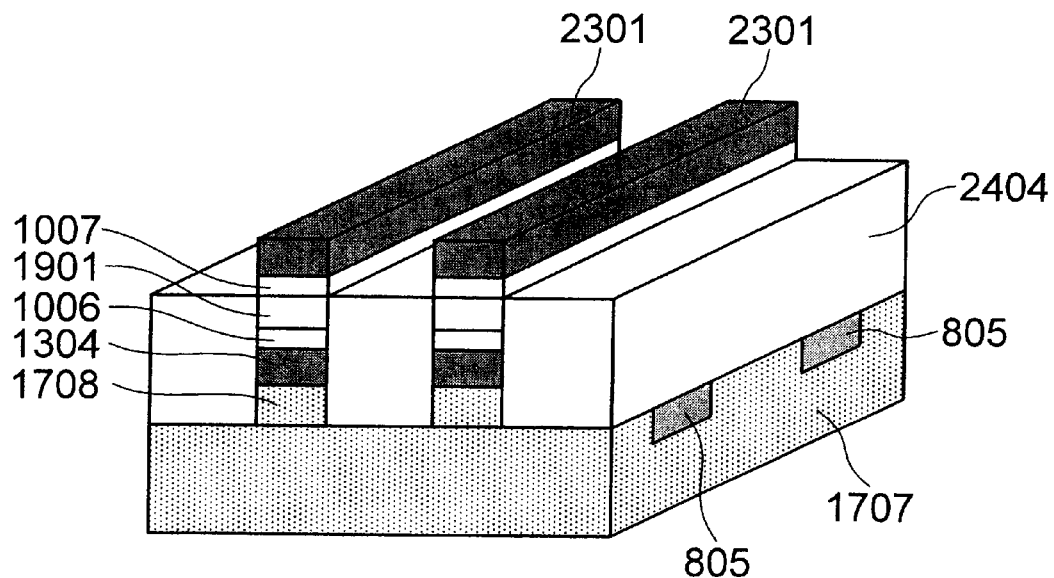
FIG. 36 is a bird's eye view in 1 manufacturing process of the semiconductor memory apparatus in accordance with the present invention.

Next, the gate insulating film 1601 is accumulated at 10 nm. In the present embodiment, the CVD method is used, however, the thermal oxidation film may be used. The state at this time is shown in FIG. 33. Next, the polycrystal line silicon forming the gate electrode and containing the impurity at a high concentration is accumulated, a side wall film 2403 is formed in accordance with a normal etchback process, further the ground gate insulating film is removed and the structure shown in FIG. 34 is obtained. Next, the polycrystal line silicon film 2404 containing the impurity at a high concentration is buried and flattened in accordance with the CMP process, and the ground tungsten 2301 is exposed. The state at this time is shown in FIG. 35. As a result, the previously formed word line 805 and the side wall polycrystal line silicon film 2403 are electrically connected. Sequentially, the polycrystal line silicon 2404 is etchbacked as shown in FIG. 36. At this time, in order to prevent an offset of the transistor, it is important that the etchbacked surface does not descend from the boundary between the N+ layer 1007 forming the diffusion layer and the channel portion 1006. An object of the etchback is to secure a short margin between the word electrode 2404 and the later formed TMR device.

Figure 37:
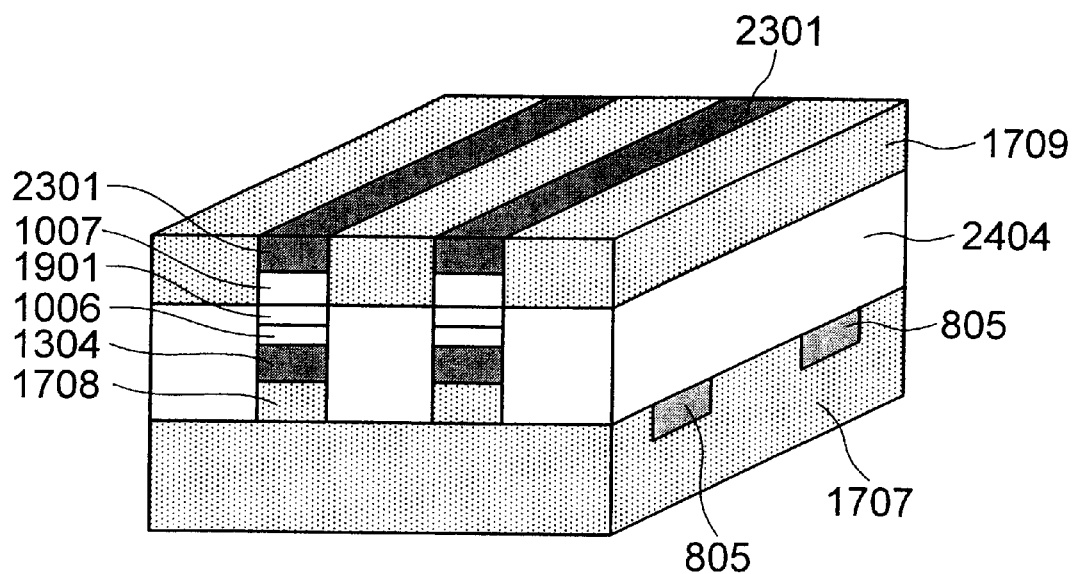
FIG. 37 is a bird's eye view in 1 manufacturing process of the semiconductor memory apparatus in accordance with the present invention.
Figure 38:
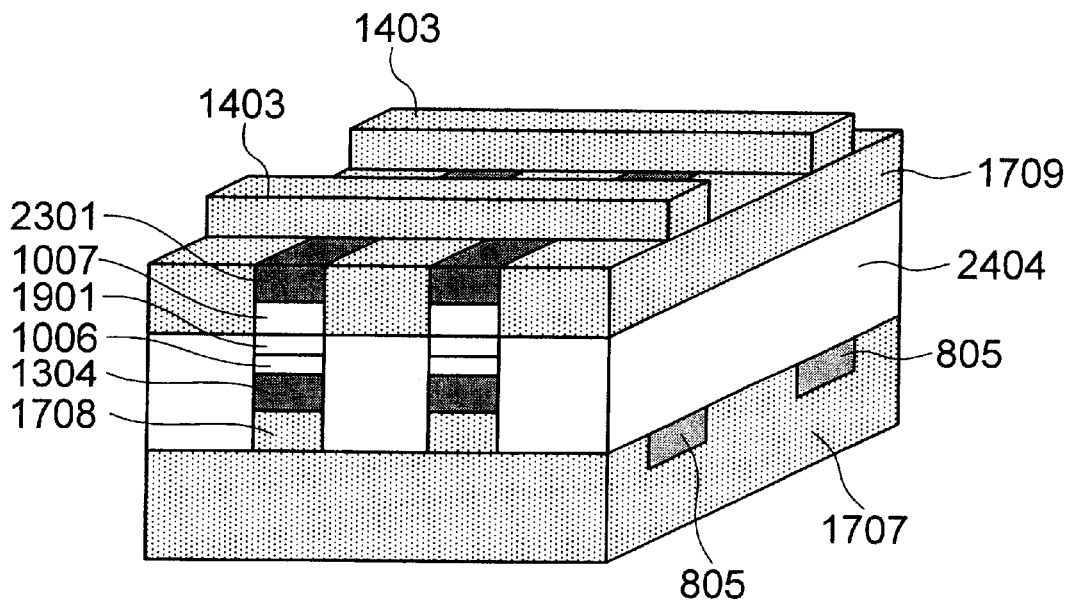
FIG. 38 is a bird's eye view in 1 manufacturing process of the semiconductor memory apparatus in accordance with the present invention.
Figure 39:
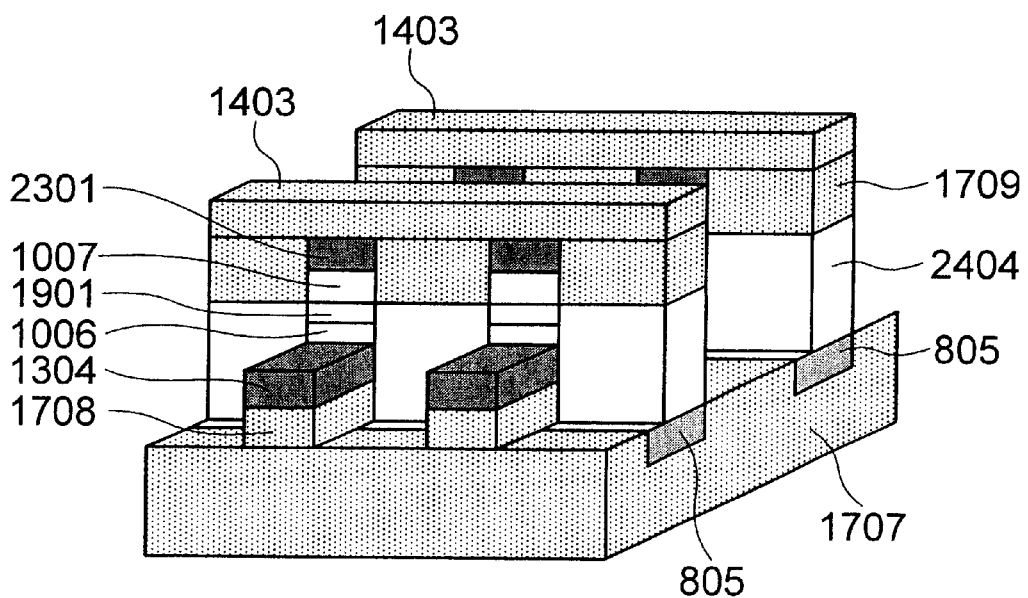
FIG. 39 is a bird's eye view in 1 manufacturing process of the semiconductor memory apparatus in accordance with the present invention.
Figure 40:
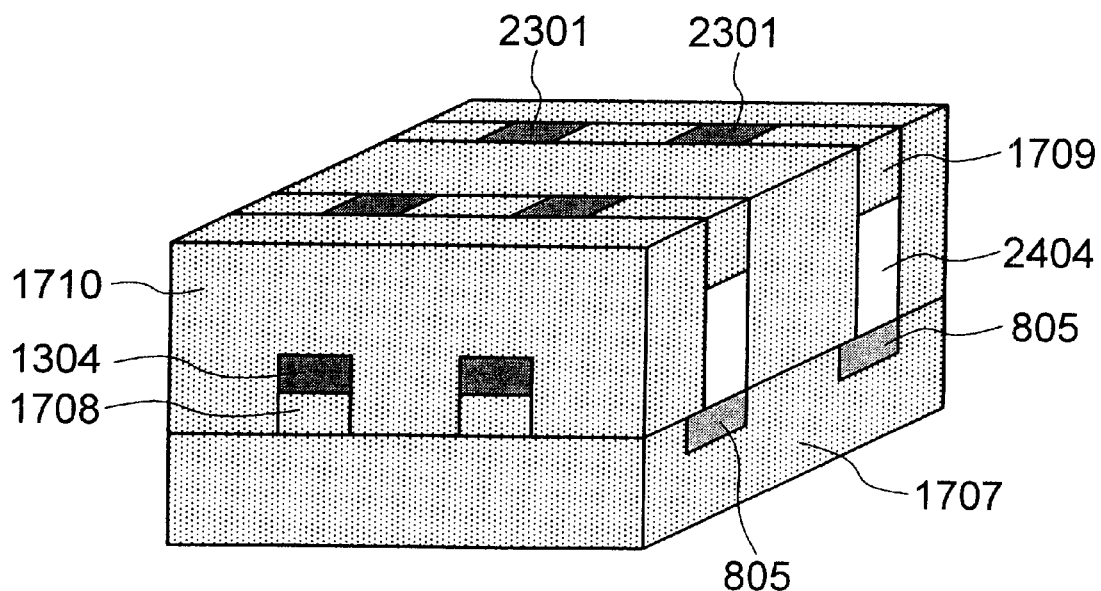
FIG. 40 is a bird's eye view in 1 manufacturing process of the semiconductor memory apparatus in accordance with the present invention.

Next, the oxide film 1709 is accumulated and flattened, the tungsten 2301 is exposed and the structure shown in FIG. 37 is obtained. Sequentially, silicon knight ride 1403 is accumulated at 100 nm, and is processed in a ling and space shape in accordance with the normal dry etching method. The state at this time is shown in FIG. 38. Further, the silicon knight ride 1403 is formed as the mask, the tungsten 2301, the oxide film 1709 and the polycrystal line silicon 1007, 1901, 1006 and 2404 are dry etched, and the structure shown in FIG. 39 is obtained. Next, the silicon oxide film 1710 is accumulated, and flattened in accordance with the CMP, the silicon knight ride 1403 is simultaneously removed, and the ground tungsten 2301 is exposed. The state at this time is shown in FIG. 40.

Figure 41:
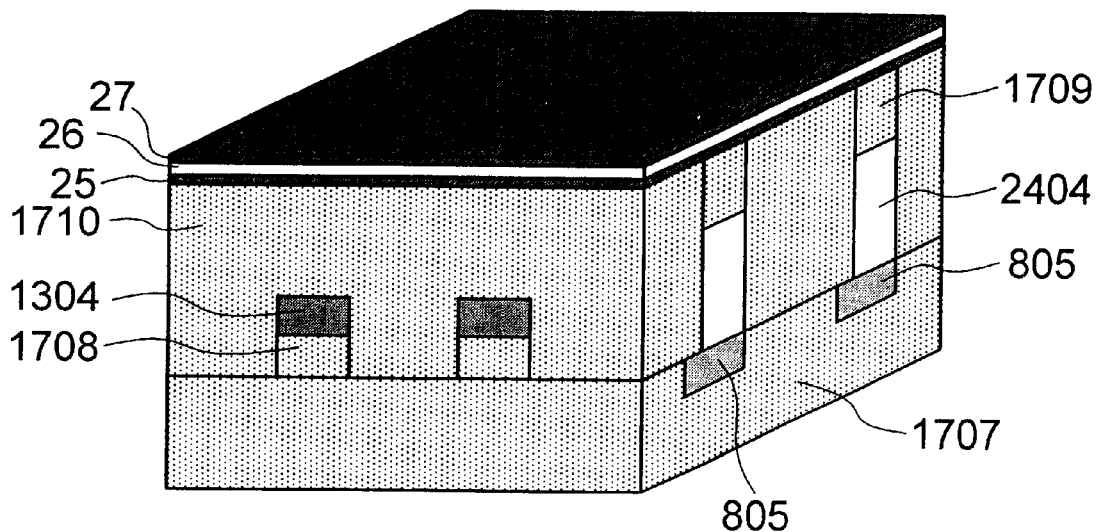
FIG. 41 is a bird's eye view in 1 manufacturing process of the semiconductor memory apparatus in accordance with the present invention.
Figure 42:
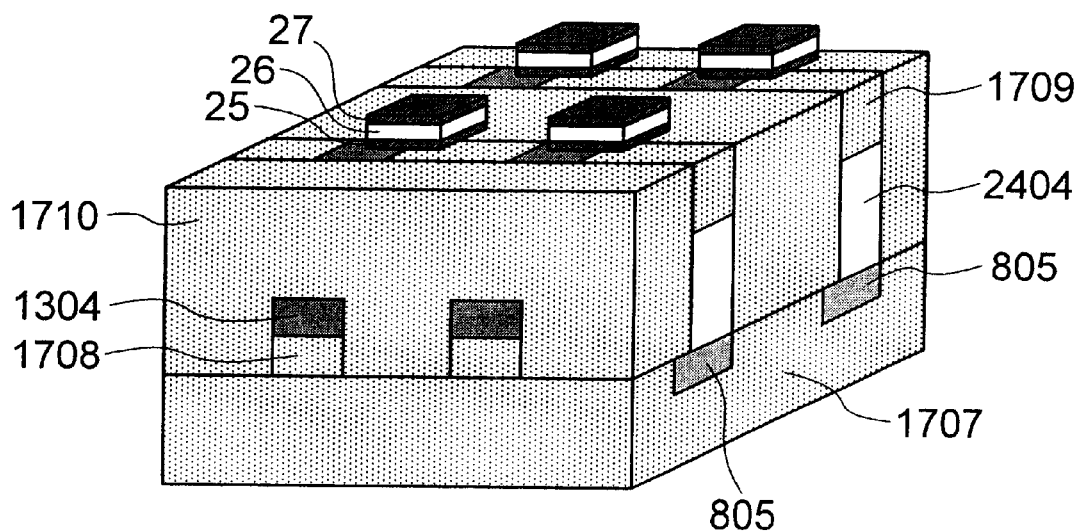
FIG. 42 is a bird's eye view in 1 manufacturing process of the semiconductor memory apparatus in accordance with the present invention.
Figure 43:
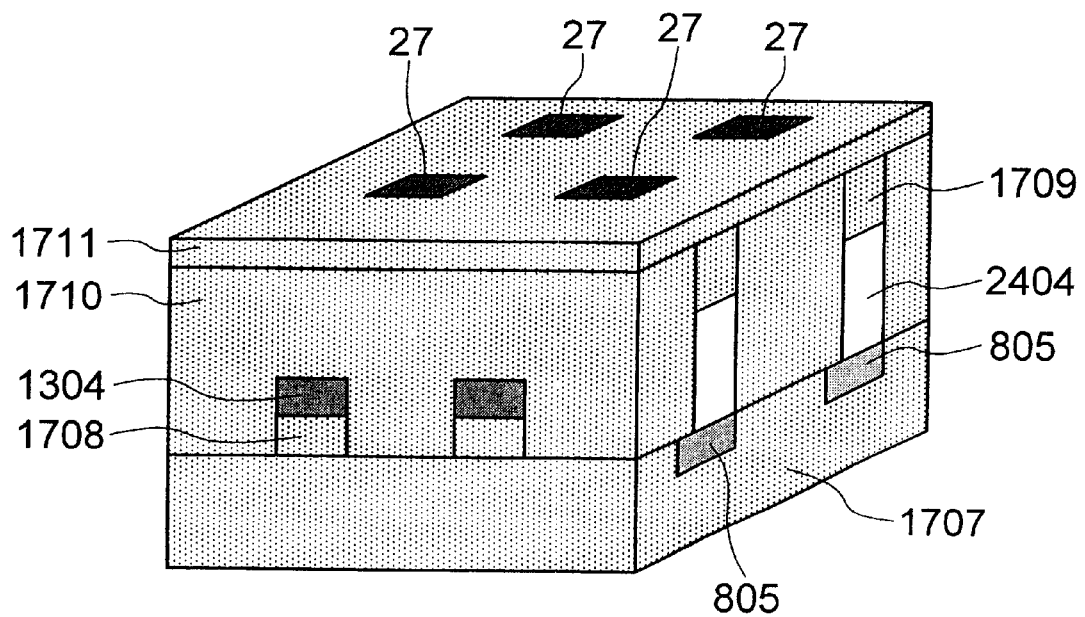
FIG. 43 is a bird's eye view in 1 manufacturing process of the semiconductor memory apparatus in accordance with the present invention.

Next, the TMR device is formed. NiFe 25, $Al_2O_3$ 26 and CoFe 27 are accumulated at this order, and the structure shown in FIG. 41 is obtained. The TMR laminated film is processed in accordance with the normal dry etching method. The state at this time is shown in FIG. 42. Further, the silicon oxide film 1711 is accumulated and flattened, the CoFe 27 constituting the TMR device is exposed, and the structure shown in FIG. 43 is obtained. At this time, if the pitch of the word line 805 formed below is reduced, a freedom of layout is increased and it is possible to intend to reduce the writing electric current as a result of utilizing a shape anisotropy effect of the TMR.

Figure 44:
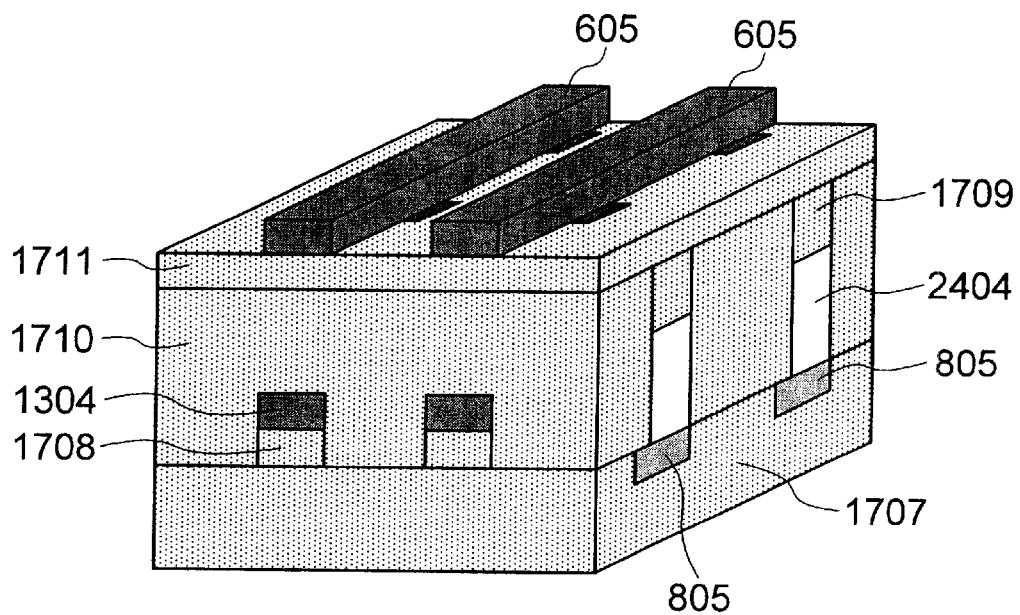
FIG. 44 is a bird's eye view in 1 manufacturing process of the semiconductor memory apparatus in accordance with the present invention.
Figure 45:
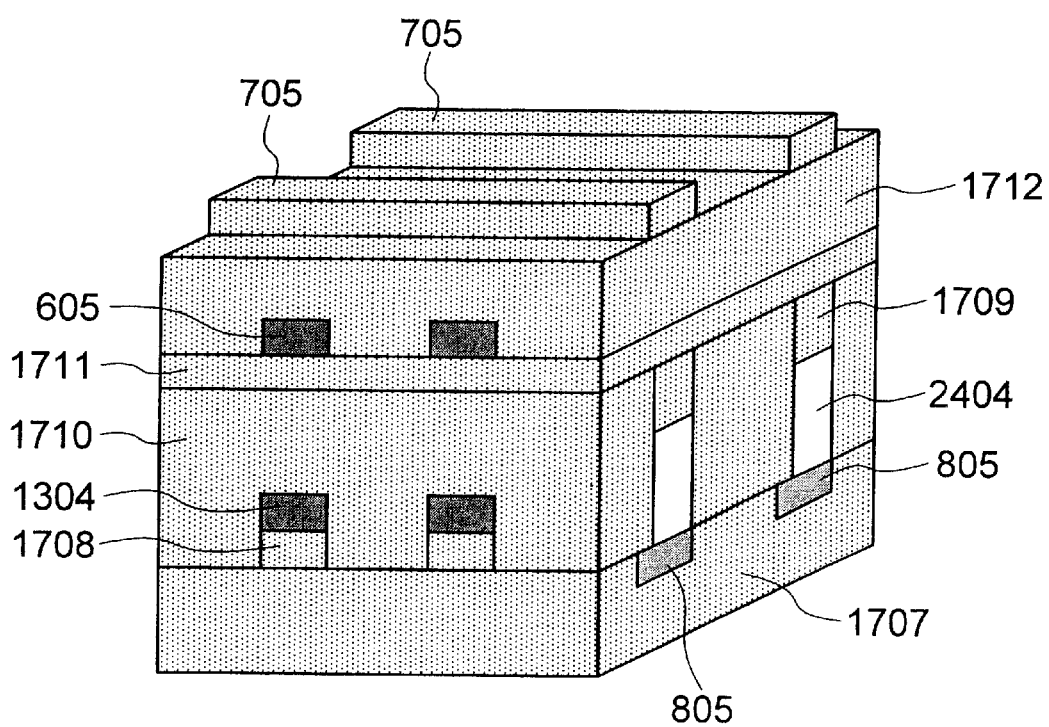
FIG. 45 is a bird's eye view in 1 manufacturing process of the semiconductor memory apparatus in accordance with the present invention.

Next, the bit line 605 is formed. For the purpose thereof, the tungsten 605 is accumulated at 100 nm, and is processed in the line and space shape shown in FIG. 44. Sequentially, the writing word line is formed. The writing word line 705 is processed after accumulating and flattening the insulating film between the layers 1712. The state at this time is shown in FIG. 45. Finally, two layers of metal wire layers are formed in accordance with the normal process, and a desired semiconductor apparatus is obtained.

Embodiment 4

Figure 46:
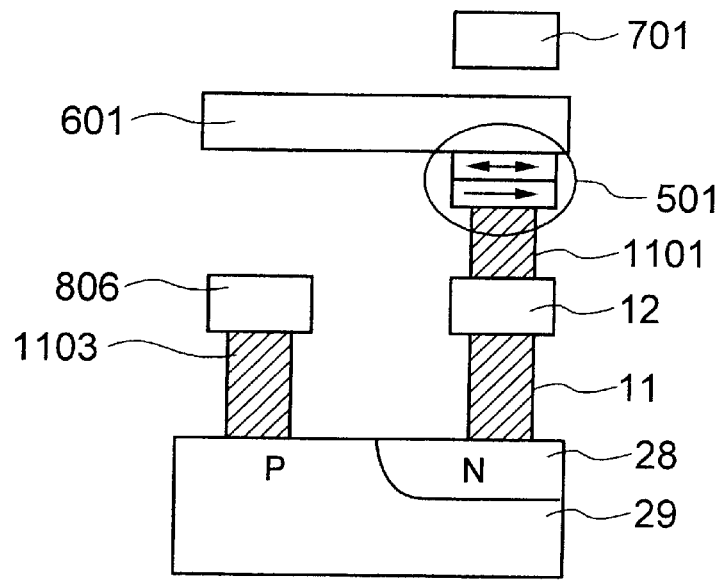
FIG. 46 is a view of the MRAM memory cell structure in accordance with the present invention.
Figure 47:
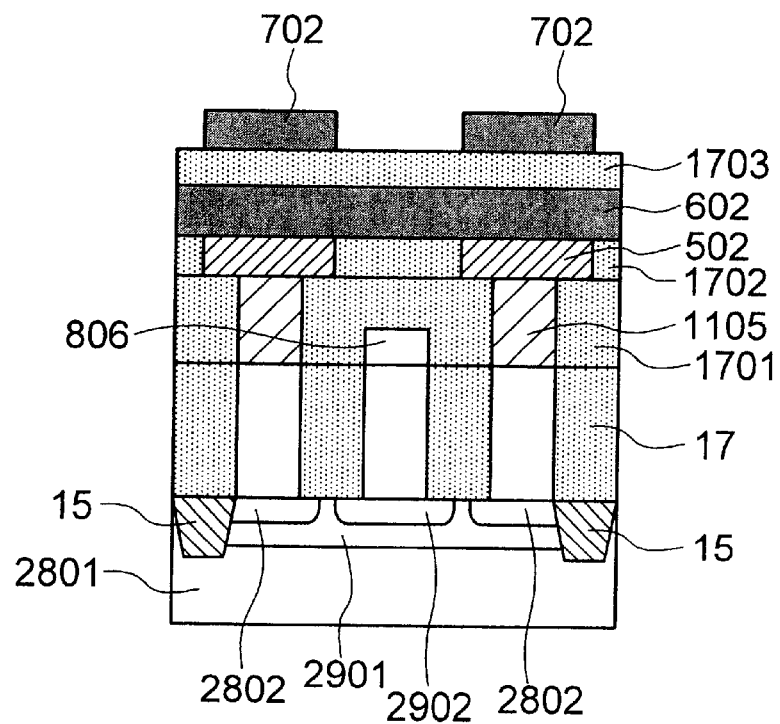
FIG. 47 is a cross sectional view in a direction parallel to the bit line in 1 manufacturing process of the semiconductor memory apparatus in accordance with the present invention.
Figure 48:
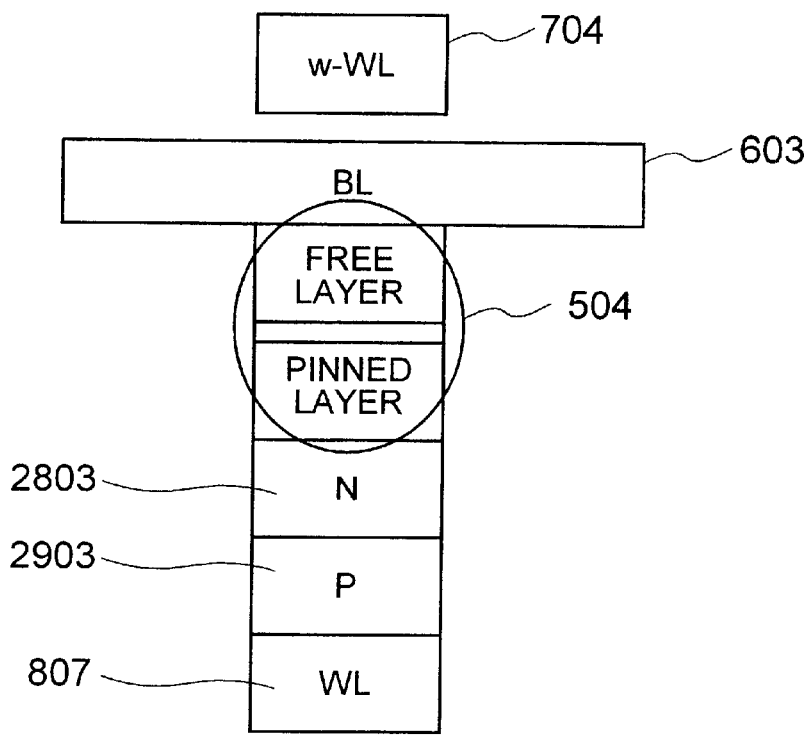
FIG. 48 is a view showing a structure of the semiconductor memory apparatus in accordance with the present invention.

The embodiments mentioned above relate to 1 transistor-1 TMR type MRAM. A concept forming the writing word line above the bit line can be of course applied to 1 diode-1 TMR type MRAM employing a diode in place of the transistor. FIG. 46 shows a schematic view of a memory cell in the case mentioned above. At a time of writing the data, a positive bias is applied to the bit line. As a result of this, a PN junction becomes under a reverse bias state, and no electric current flows. On the contrary, at a time of reading out, a negative electric potential is applied to the bit line, and the junction is made under a regular bias state. It is possible to obtain a desired semiconductor memory apparatus a memory cell portion of which is shown in FIG. 47 as a cross sectional view, by using substantially the same manufacturing process as that mentioned in the embodiment 1. Of course, it goes without saying that the PN junction constituted by the polycrystal line silicon can be employed as the diode. In this case, the structure of the memory cell is as shown in FIG. 48.

Embodiment 5

Figure 49:
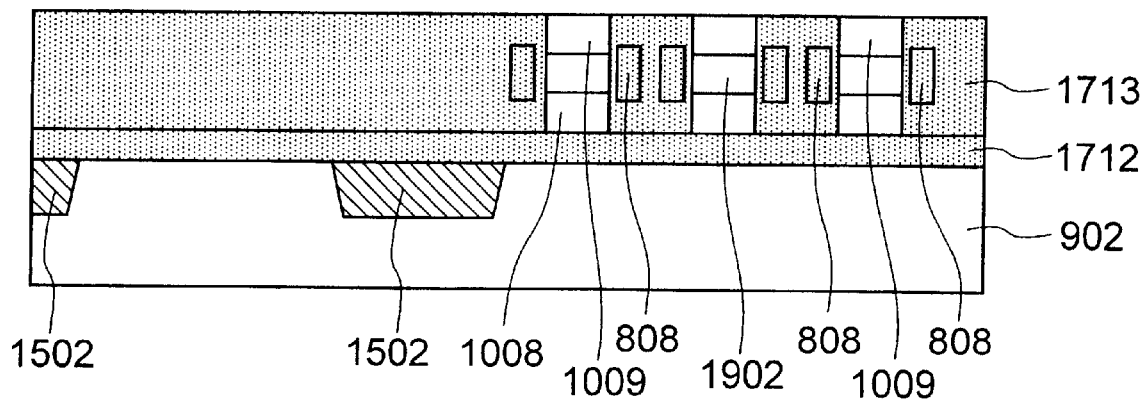
FIG. 49 is a cross sectional view in a direction vertical to the word line in 1 manufacturing process of the semiconductor memory apparatus in accordance with the present invention.
Figure 50:
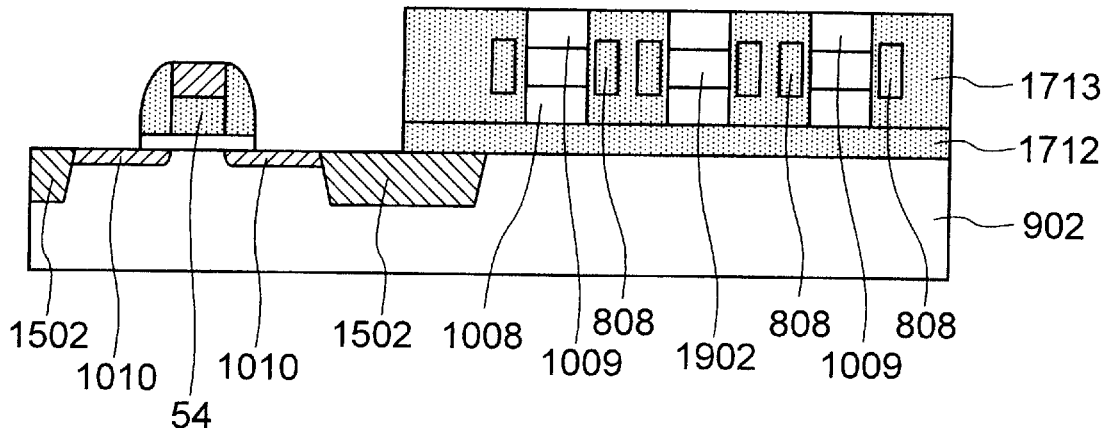
FIG. 50 is a cross sectional view in a direction vertical to the word line in 1 manufacturing process of the semiconductor memory apparatus in accordance with the present invention.
Figure 51:
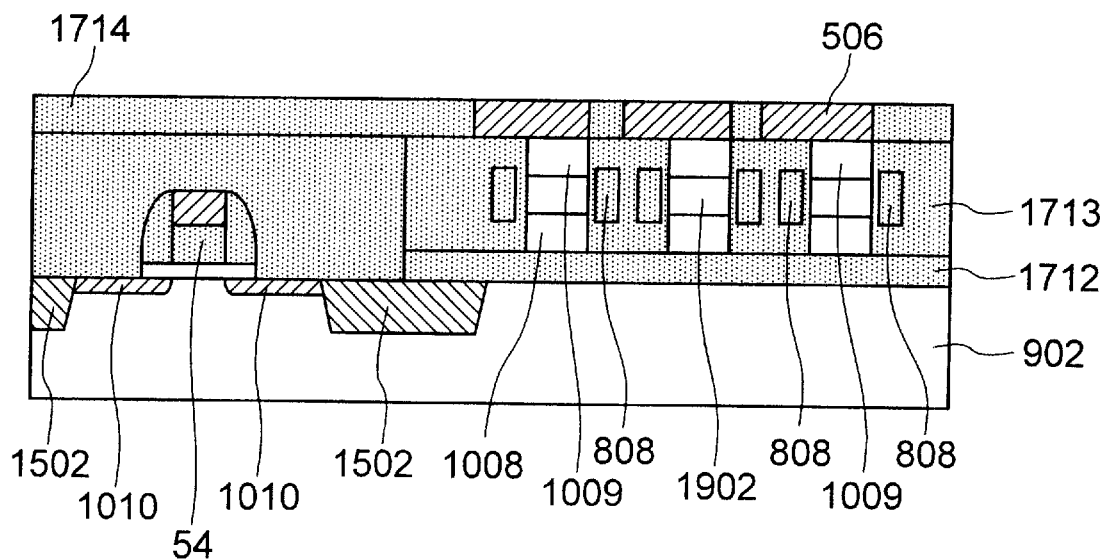
FIG. 51 is a cross sectional view in a direction vertical to the word line in 1 manufacturing process of the semiconductor memory apparatus in accordance with the present invention.
Figure 52:
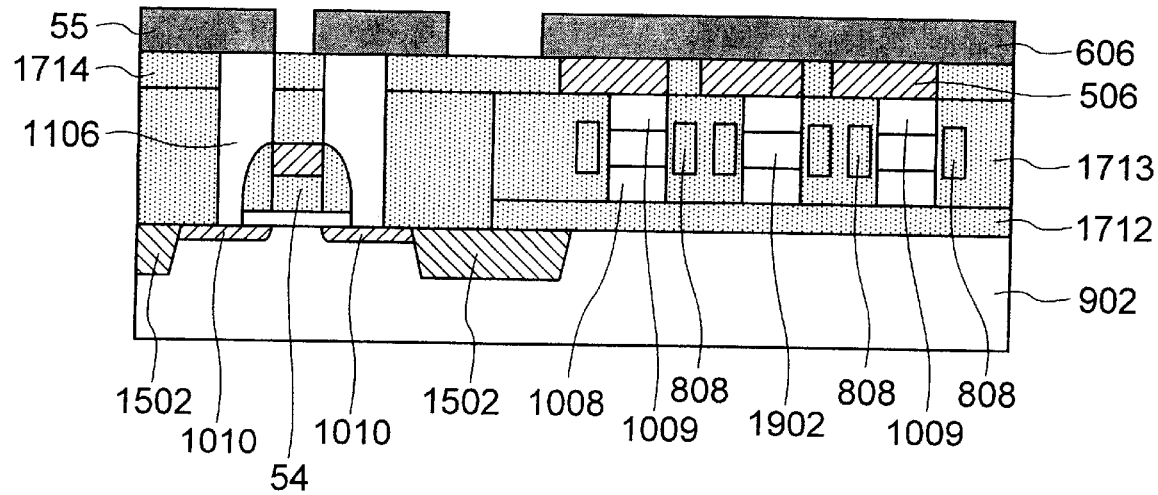
FIG. 52 is a cross sectional view in a direction vertical to the word line in 1 manufacturing process of the semiconductor memory apparatus in accordance with the present invention.
Figure 53:
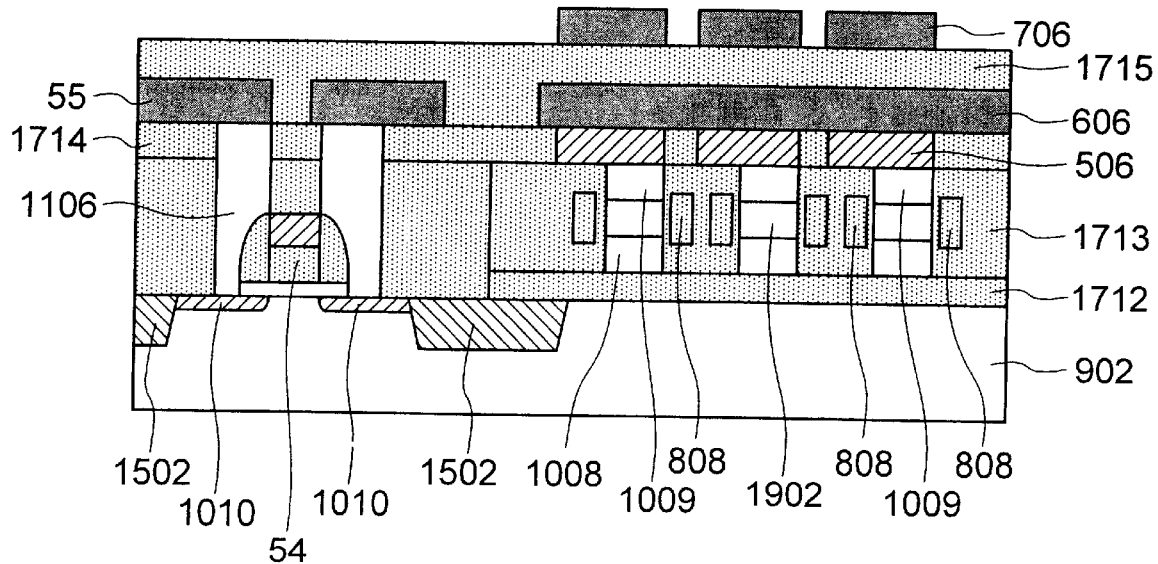
FIG. 53 is a cross sectional view in a direction vertical to the word line in 1 manufacturing process of the semiconductor memory apparatus in accordance with the present invention.

The present embodiment relates to an MRAM having a vertical path transistor for a logic embedded memory devices. In order to give a maximum performance to the peripheral transistor, the structure is made in accordance with the following order. At first, the memory cell transistor is formed. The state at this time is shown in FIG. 49. Sequentially, a relative insulating film 1712 and 1713 in the peripheral circuit area is removed, the transistor is formed and the structure shown in FIG. 50 is obtained. Further, the TMR 506 is formed, and is flattened by the relative insulating film 1714. The state at this time is shown in FIG. 51. Since the heat resistance of the TMR is about 400° C., the TMR device property and the peripheral circuit performance are not deteriorated by forming in the order mentioned above. Next, after forming the conductive plug 1106 in the peripheral circuit area, the metal wire layer is formed, and the structure shown in FIG. 52 is obtained. The wire layer forms the bit line 606 in the memory array area, and forms the first metal wire layer 55 in the peripheral circuit area. Next, the relative insulating film 1715 is accumulated and flattened, and the writing word line 706 is formed. The state at this time is shown in FIG. 53. Finally, a multi-level metallization is formed and a desired semiconductor memory apparatus is obtained.

In accordance with the present invention, in the MRAM utilizing the tunnel magnetic resistance, the following two effects can be obtained by forming the writing word line above the bit line. One of them is to simplify the process. Another of them is to improve a reliability of the memory operation, in particular, the writing operation. Further, it is possible to reduce the cell area in comparison with the conventional DRAM by applying the present invention to the MRAM having the vertical transistor.

What is claimed is:

1. A semiconductor memory apparatus comprising:

first and second word lines arranged in parallel to each other;

a data line crossing said first and second word lines via an insulating layer; and a plurality of memory cells provided at nodal points of said first and second word lines and said data line, wherein said data line extends between said first and second word lines so that one of said word line is above said data line, and each of said memory cells has a lamination film of magnetic material and an insulating material, and said magnetic material exists under a lower portion of said data line.

2. A semiconductor memory apparatus as claimed in claim 1, wherein said magnetic material layer is formed in a rectangular shape having a long side in a direction of said data line.

3. A semiconductor memory apparatus as claimed in one of claims 1 or 2, wherein at least one of said first and second word lines is a gate electrode of a selective transistor.

4. A semiconductor memory apparatus as claimed in claim 3, wherein said selective transistor is comprised of a polycrystalline silicon line formed on a semiconductor substrate.

5. A semiconductor memory apparatus as claimed in claim 4, wherein a plurality of said first word lines are formed over an upper portion of said data line via an insulating film and wherein a plurality of said second word lines are provided, corresponding to gate electrodes of a plurality of said selective transistors, wherein a wiring pitch of said first word lines is larger than a wiring pitch of said second word lines.

6. A semiconductor memory apparatus as claimed in claim 3, wherein said selective transistor is a vertical transistor in which a channel portion is formed in a depth direction of the apparatus.

7. A semiconductor memory apparatus as claimed in claim 6, wherein a plurality of said first word lines are formed over an upper portion of said data line via an insulating film and wherein a plurality of said second word lines are provided, corresponding to gate electrodes of a plurality of said selective transistors, wherein a wiring pitch of said first word lines is larger than a wiring pitch of said second word lines.

8. A semiconductor memory apparatus as claimed in claim 3, wherein a plurality of said first word lines are formed over an upper portion of said data line via an insulating film and wherein a plurality of said second word lines are provided, corresponding to gate electrodes of a plurality of said selective transistors, wherein a wiring pitch of said first word lines is larger than a wiring pitch of said second word lines.

9. A semiconductor memory apparatus as claimed in one of claims 1 or 2, wherein each of said memory cells comprises said magnetic material and a rectifier connected in series between one of said first and second word lines and said data line.

10. A semiconductor memory apparatus as claimed in claim 9, wherein said rectifier is comprised of a polycrystalline silicon formed on the semiconductor substrate.

11. A semiconductor memory apparatus comprising:

a plurality of word lines;

a plurality of data lines crossing said word lines via an insulating layer; and a plurality of memory cells provided at nodal points of said word lines and said data lines, wherein each of said memory cells is comprised of a vertical transistor in which a channel portion is formed in a depth direction of the apparatus, and a magnetic material arranged in the direction between said vertical transistor and said data lines.

12. A semiconductor memory apparatus comprising:

a plurality of word lines;

a plurality of data lines crossing said word lines via an insulating layer; and a plurality of memory cells provided at nodal points of said word lines and said data lines, wherein each of said memory cells is comprised of a vertical transistor in which a channel portion is formed in a depth direction of the apparatus, and a magnetic material arranged in the depth direction, and said word lines are formed above upper portions of said data lines via insulating films, and said magnetic material is located under said data lines.

13. A semiconductor memory device comprising:

a word line extending in a first direction;

a data line located under said word line and separated from the word line by an insulating layer, wherein said data line extends in a second direction substantially parallel to the first direction; and a memory cell located under a cross-over point of said word line and said data line, said memory cell being located under said data line such that said data line is located between said word line and said memory cell, wherein said memory cell comprises a tunnel magneto resistance.

14. A semiconductor memory device according to claim 13, wherein said word line is a writing word line for the semiconductor memory device.

15. A semiconductor memory device according to claim 14, wherein said writing word line substantially covers said memory cell when viewed from a plan view of said semiconductor memory device.

16. A semiconductor memory device according to claim 13, wherein said word line substantially completely covers said memory cell when viewed from a plan view of the semiconductor memory device.

17. A semiconductor memory device according to claim 13, further comprising a selective transistor for the memory cell located under said tunnel magneto resistor.

18. A semiconductor memory device according to claim 17, wherein said word line is a writing word line for the semiconductor memory device.

19. A semiconductor memory device according to claim 18, wherein said selective transistor includes a read-out word line located under the data line and substantially parallel to the writing word line.

20. A semiconductor memory device according to claim 17, wherein said selective transistor is a vertical transistor formed to have a channel region extending depth-wise into the semiconductor device.

21. A semiconductor memory device according to claim 20, wherein said select transistor includes a read-out word line located under the data line and substantially parallel to the writing word line.

22. A semiconductor memory device according to claim 20, wherein the channel region of the vertical transistor is located under the tunnel magneto resistor and under the writing word line.

* * * * *